(12) United States Patent
Okamura

(10) Patent No.: US 7,936,005 B2
(45) Date of Patent: May 3, 2011

(54) SEMICONDUCTOR MEMORY DEVICE INCLUDING LAMINATED GATE HAVING ELECTRIC CHARGE ACCUMULATING LAYER AND CONTROL GATE AND METHOD OF MANUFACTURING THE SAME

(75) Inventor: Takayuki Okamura, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/473,709

(22) Filed: May 28, 2009

(65) Prior Publication Data

US 2009/0294835 A1 Dec. 3, 2009

(30) Foreign Application Priority Data

May 29, 2008 (JP) ................................. 2008-141477

(51) Int. Cl.
*H01L 29/792* (2006.01)
(52) U.S. Cl. .......... 257/324; 257/E29.309; 257/E21.426
(58) Field of Classification Search .................. 257/324, 257/E29.309, E21.426
See application file for complete search history.

(56) References Cited

U.S. PATENT DOCUMENTS

| 6,411,548 | B1 * | 6/2002 | Sakui et al. ............. 365/185.17 |
| 6,765,261 | B2 | 7/2004 | Widdershoven |
| 6,781,193 | B2 | 8/2004 | Lee et al. |
| 6,784,481 | B2 | 8/2004 | Shin et al. |
| 6,969,660 | B2 * | 11/2005 | Goda et al. .................... 438/286 |
| 7,038,291 | B2 | 5/2006 | Goda et al. |
| 7,064,382 | B2 | 6/2006 | Kodama et al. |
| 2002/0033501 | A1 | 3/2002 | Sakagami |
| 2005/0285219 | A1 | 12/2005 | Sakagami |
| 2008/0237688 | A1 * | 10/2008 | Yasuda ........................ 257/316 |

FOREIGN PATENT DOCUMENTS

| JP | 2003-243543 | 8/2003 |
| JP | 2008-053651 | 3/2008 |
| KR | 2006-135237 | 12/2006 |

OTHER PUBLICATIONS

Jae Sung Sim, et al., "Self Aligned Trap-Shallow Trench Isolation Scheme for the Reliability of TANOS (TaN/AlO/SiN/Oxide/Si) NAND Flash Memory", 2007 $22^{nd}$ IEEE Non-Volatile Semiconductor Memory Workshop, Aug. 2007, p. 110-111.
Office Action issued Dec. 27, 2010, in Korean Patent Application No. 10-2009-47735 (with English-language translation) 10 pages.

* cited by examiner

*Primary Examiner* — Bradley K Smith
*Assistant Examiner* — Mohammad T Karimy
(74) *Attorney, Agent, or Firm* — Oblon, Spivak, McClelland, Maier & Neustadt, L.L.P.

(57) ABSTRACT

A semiconductor memory device includes a first active region, a second active region, an element isolation region, memory cell transistors. Each of memory cell transistors includes a laminated gate and a first impurity diffusion layer functioning as a source and a drain. The laminated gate includes a first insulating film, a second insulating film, and a control gate electrode. The second insulating film is commonly connected between the plurality of memory cell transistors to step over the element isolation region and is in contact with an upper surface of the element isolation region. An upper surface of the element isolation region is higher than a bottom surface of the first insulating film and is located under the upper surface of the first insulating film.

9 Claims, 30 Drawing Sheets

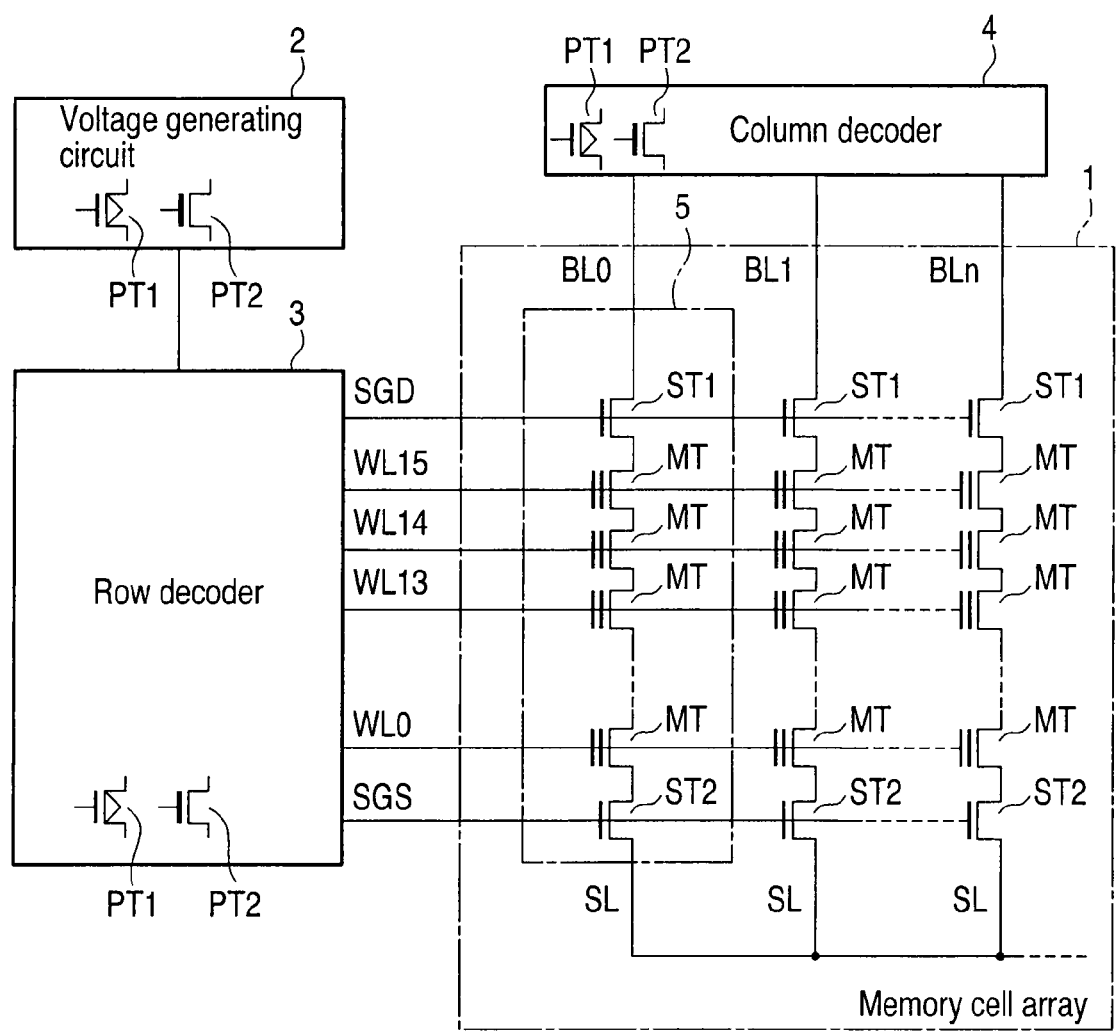
F I G. 1

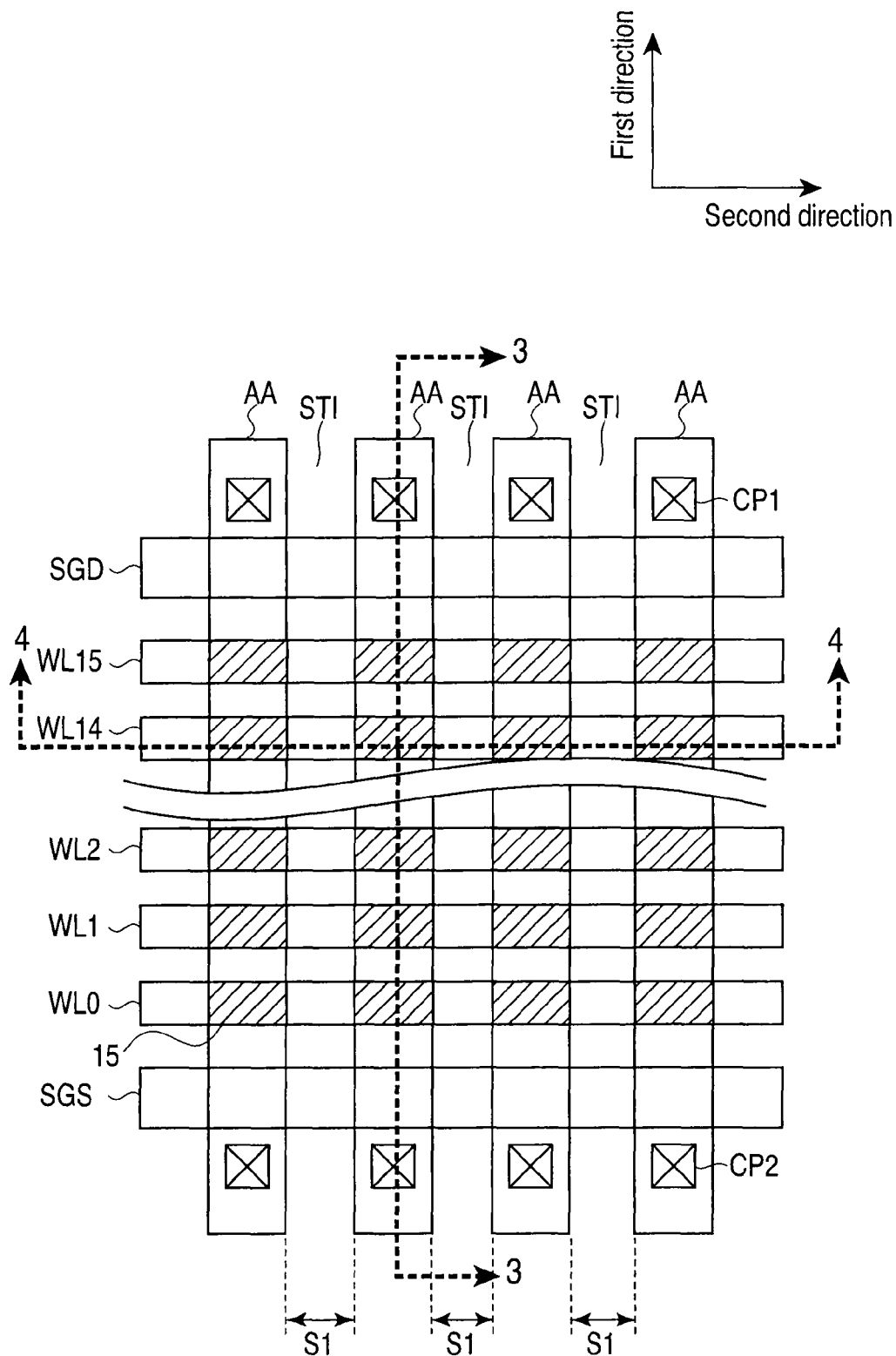
F I G. 2

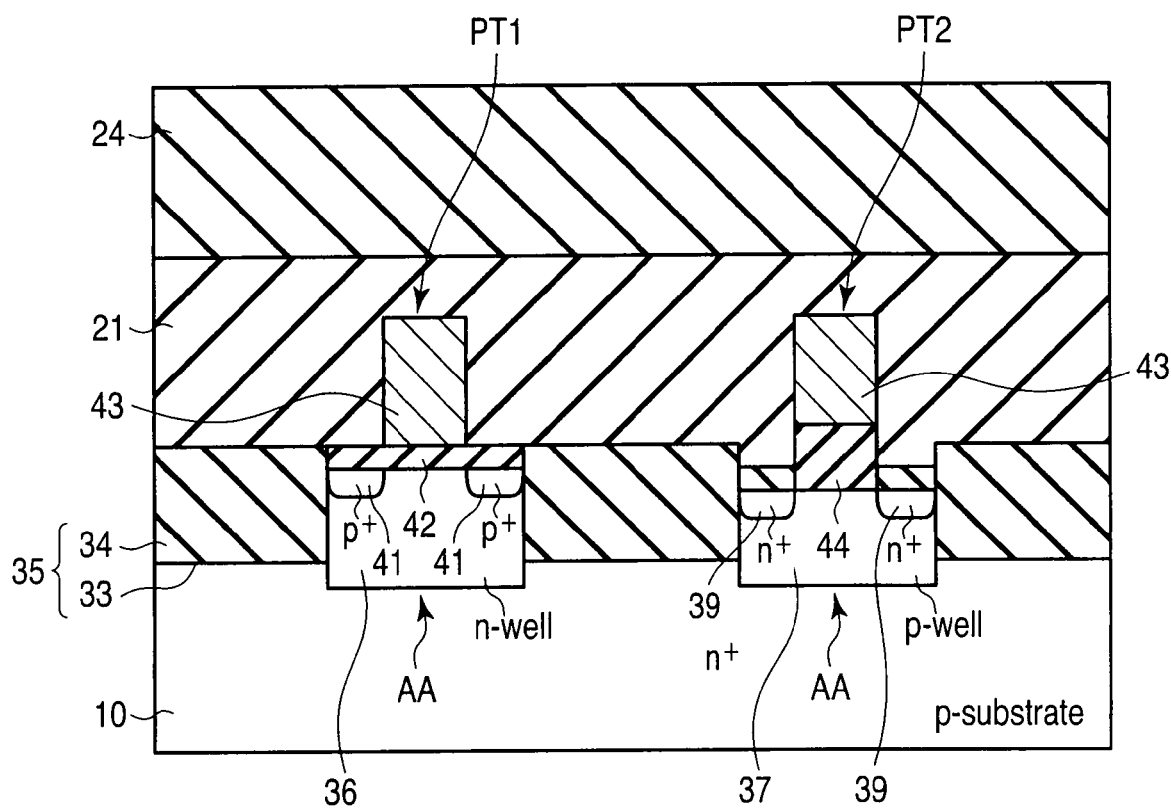
F I G. 5

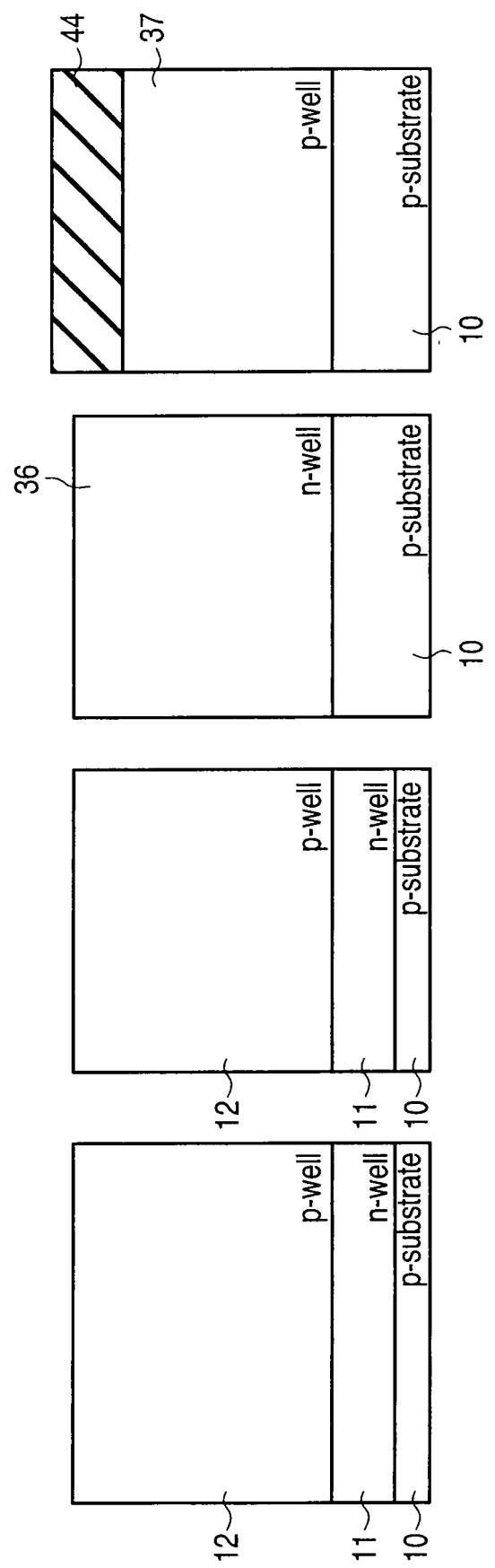

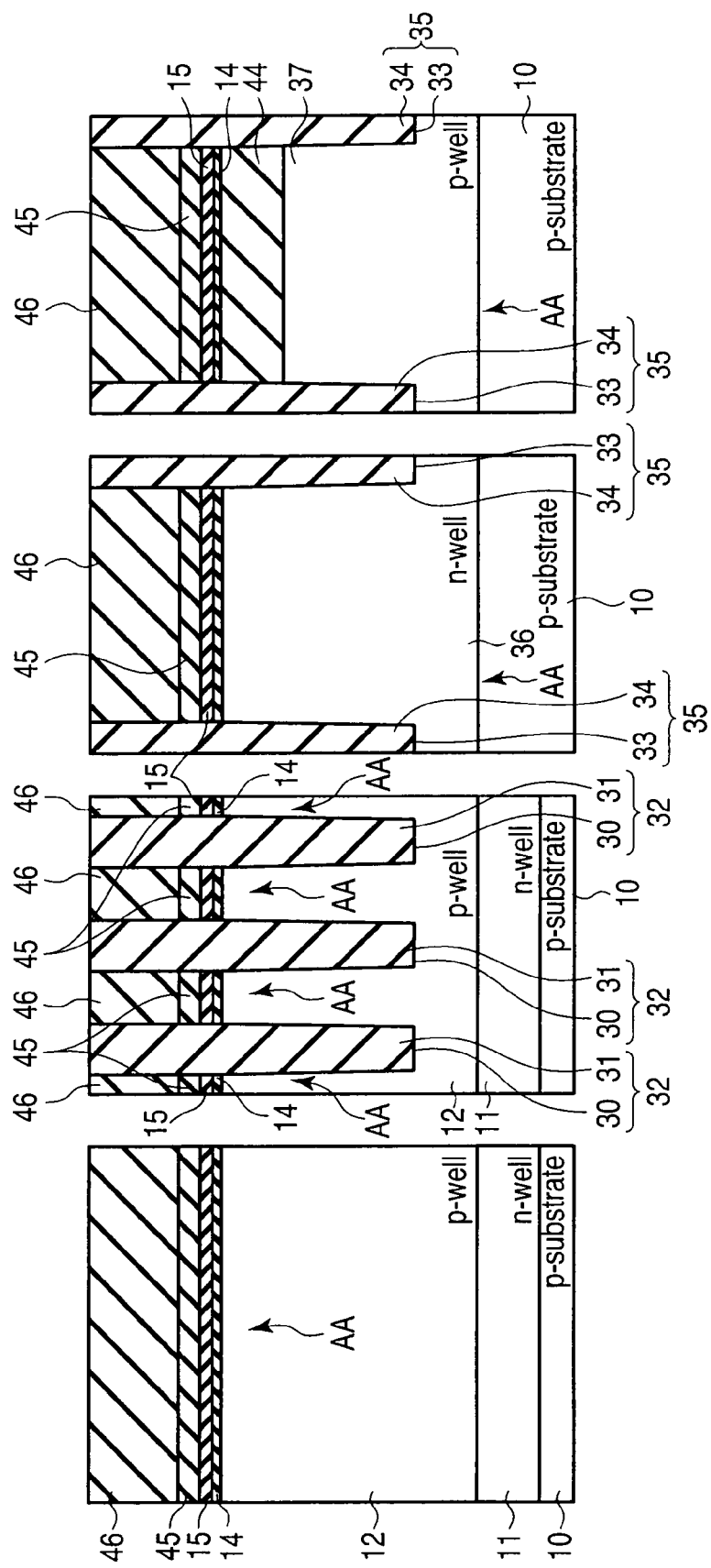

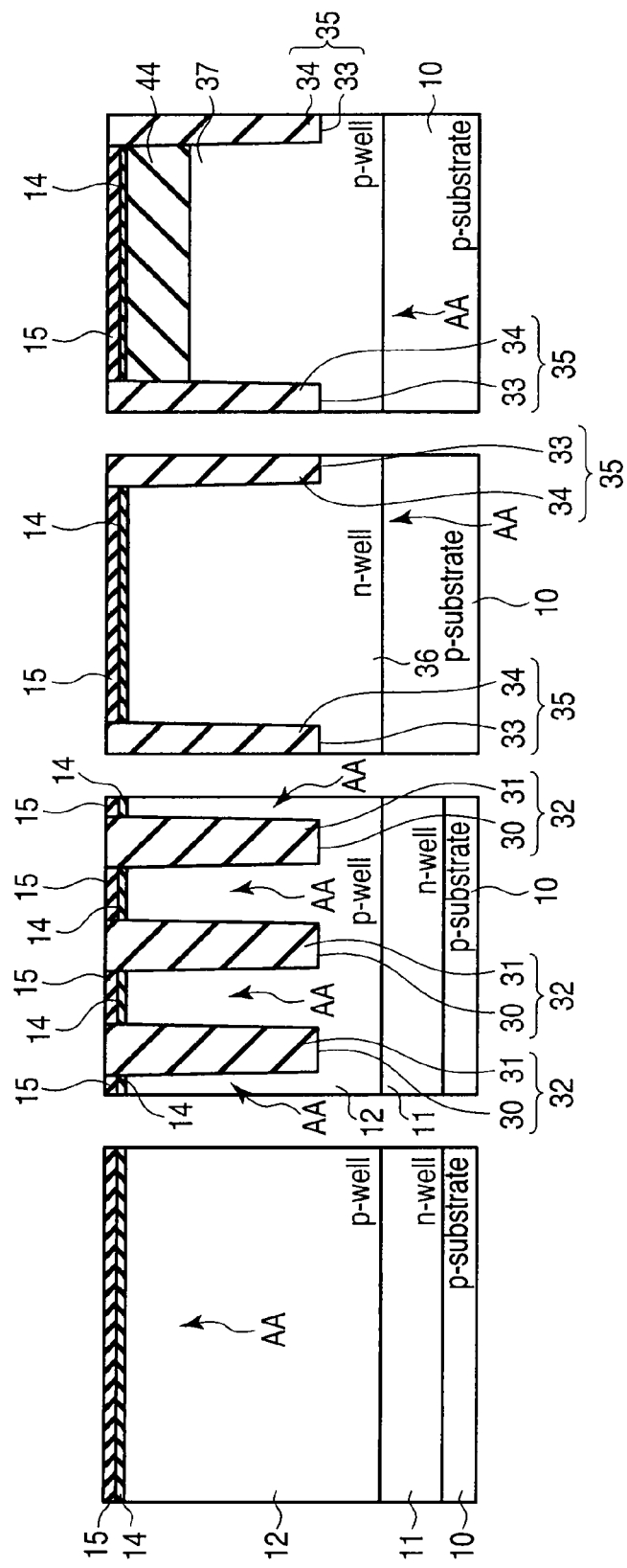

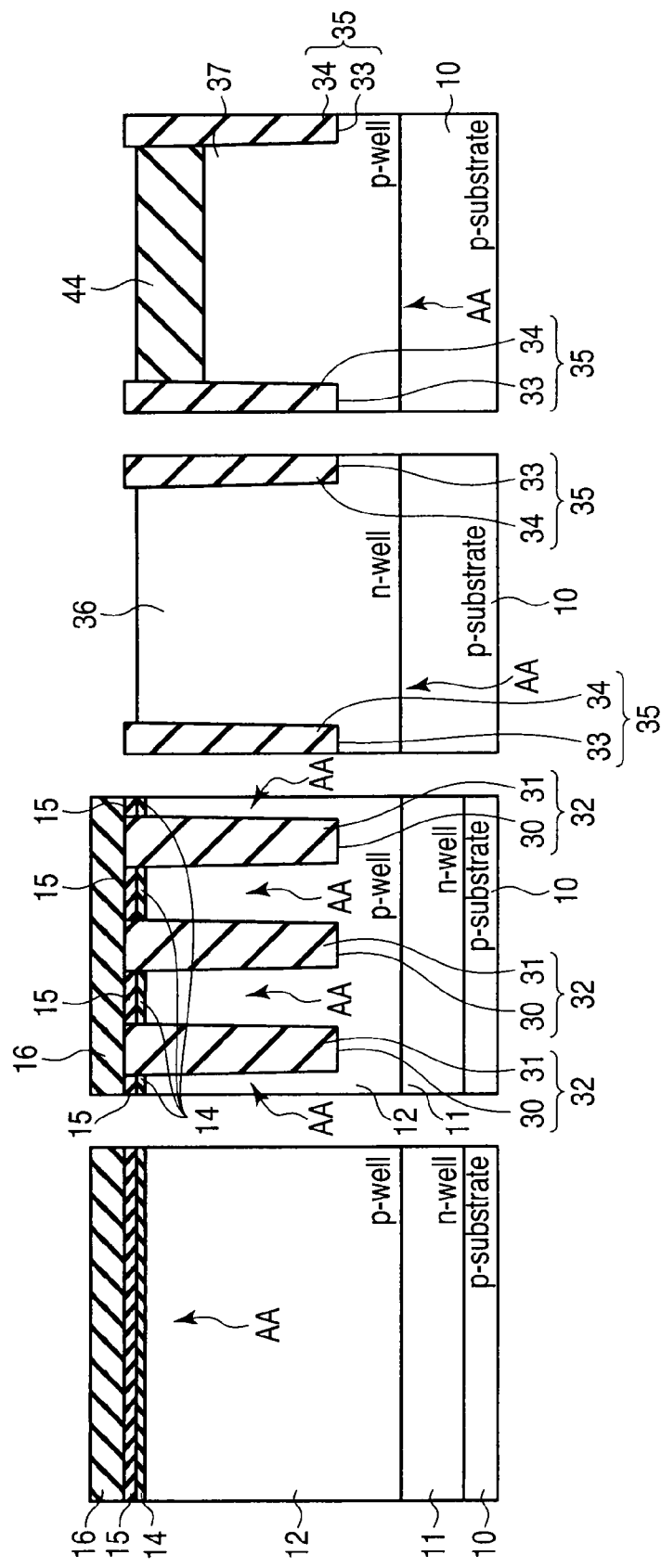

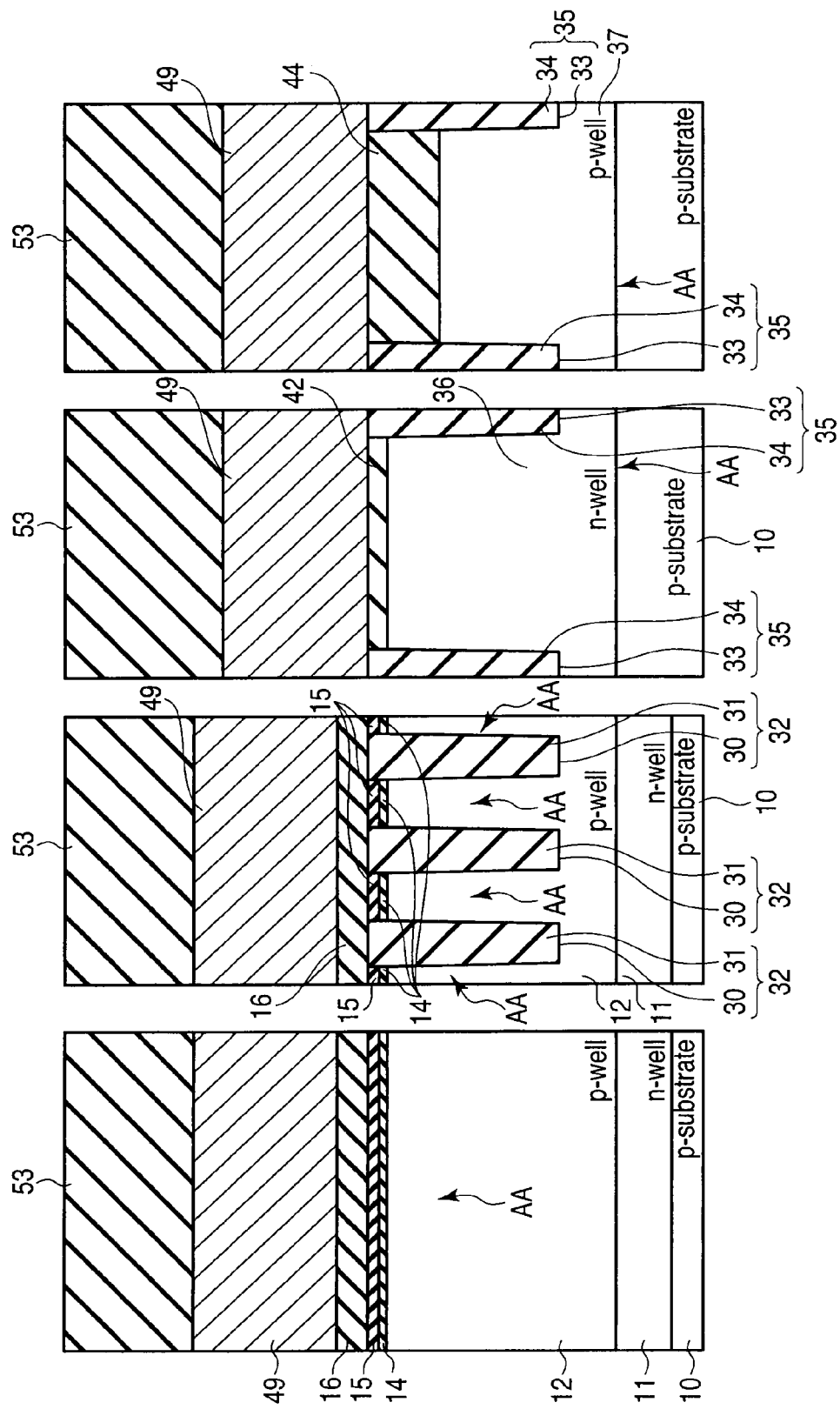
F I G. 15A
F I G. 15B
F I G. 15C
F I G. 15D

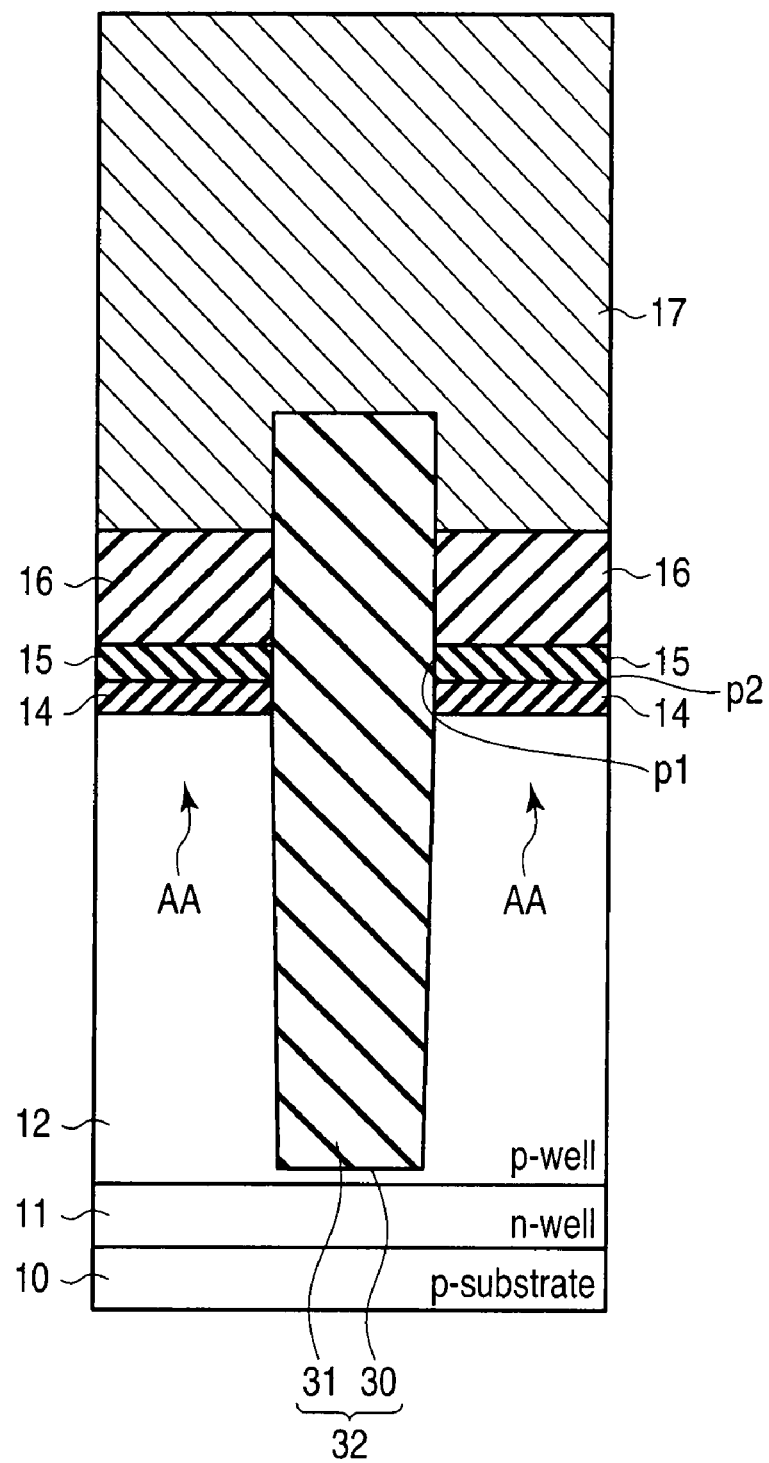
F I G. 19

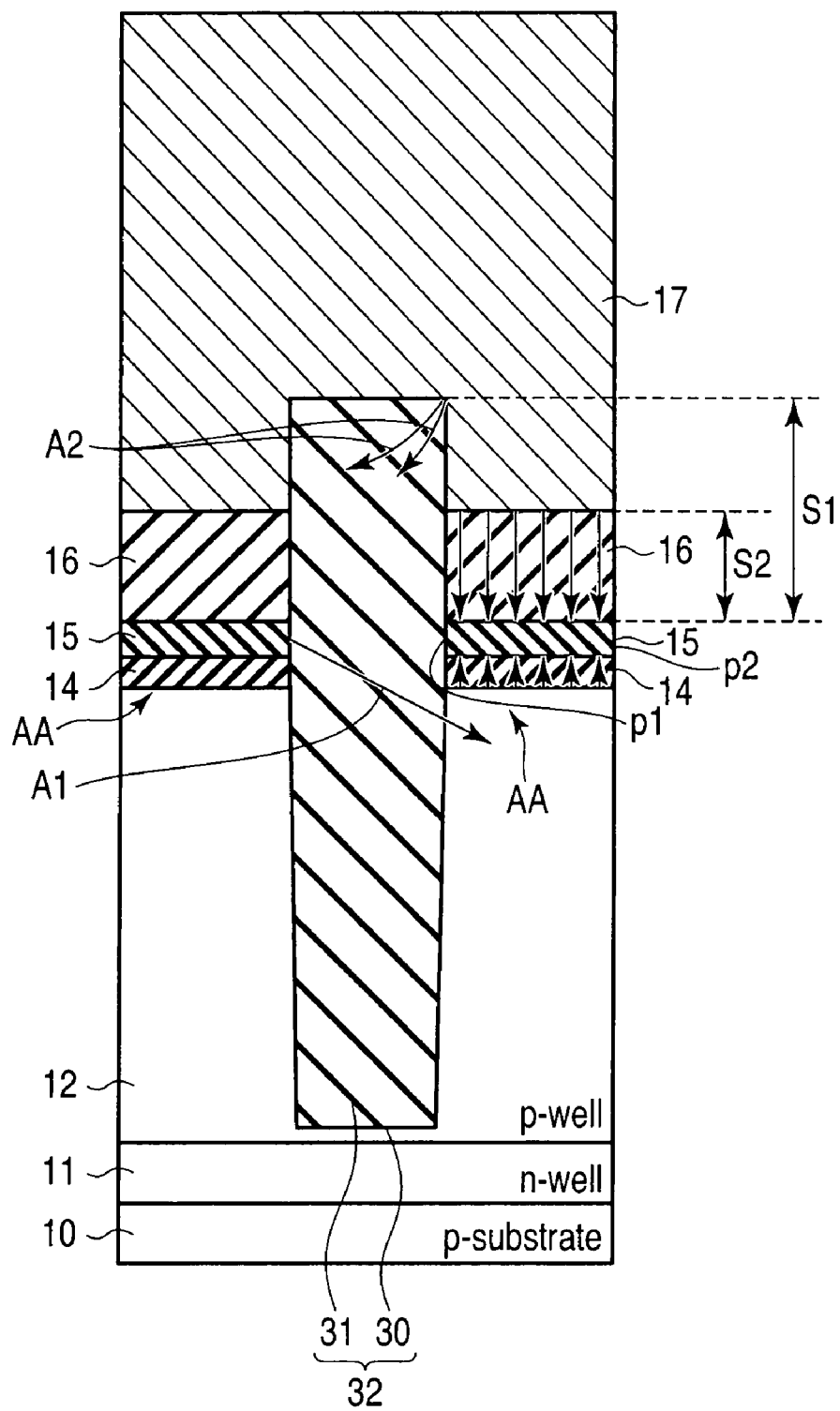
F I G. 20

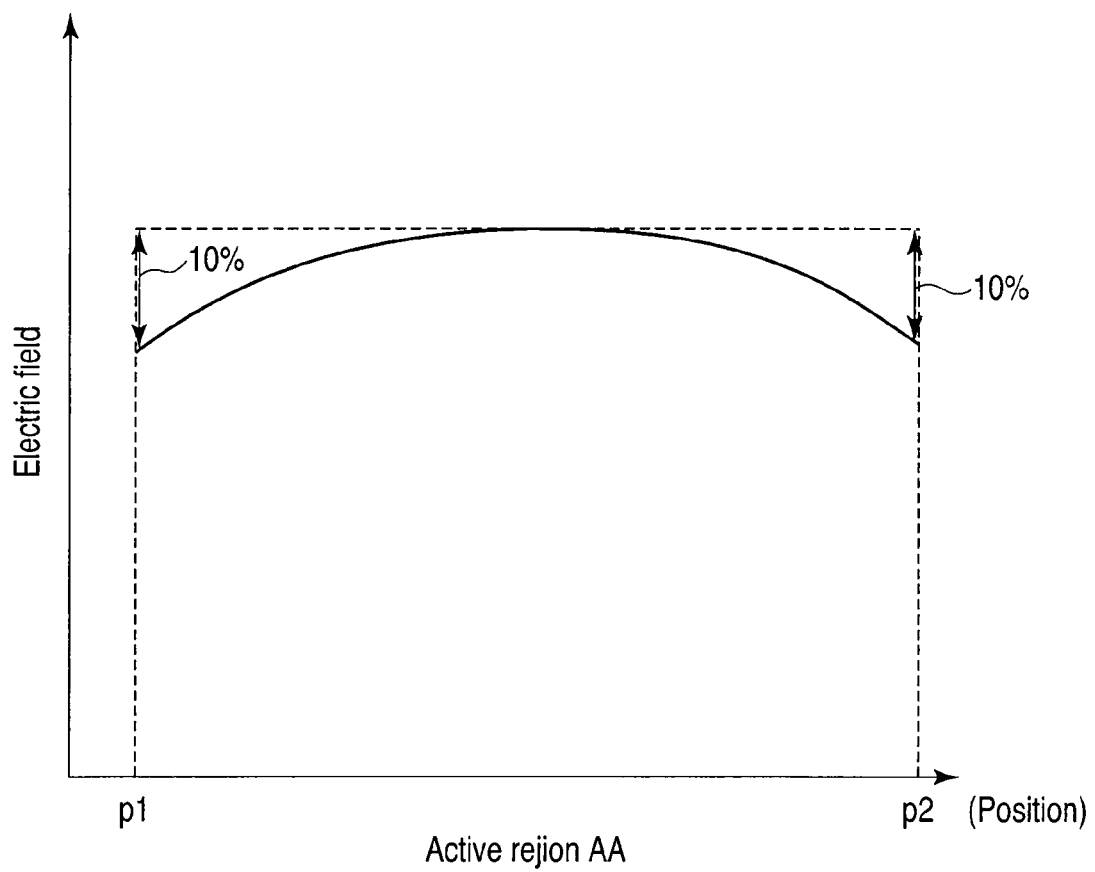
F I G. 21

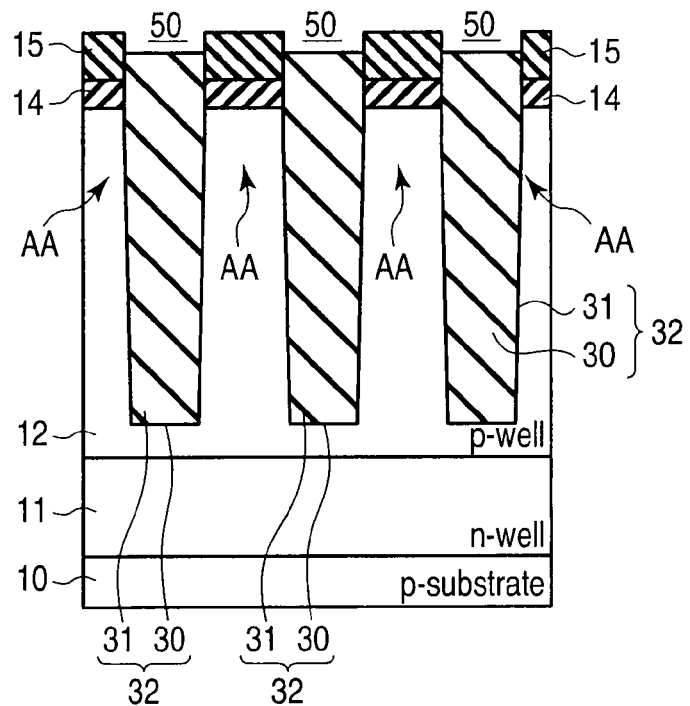
F I G. 25A
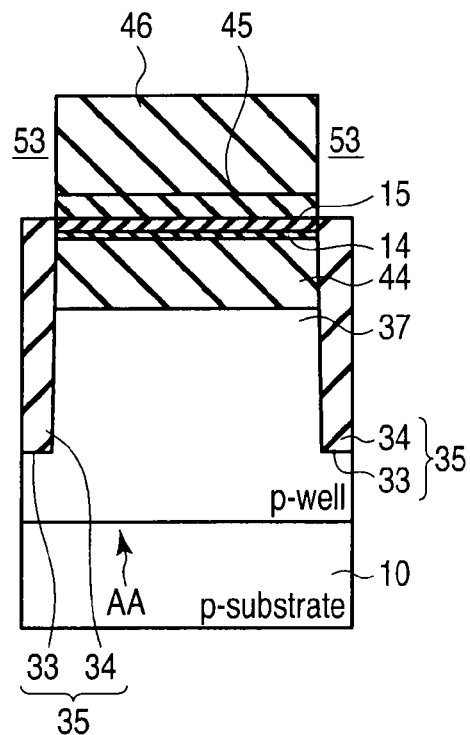
F I G. 25B

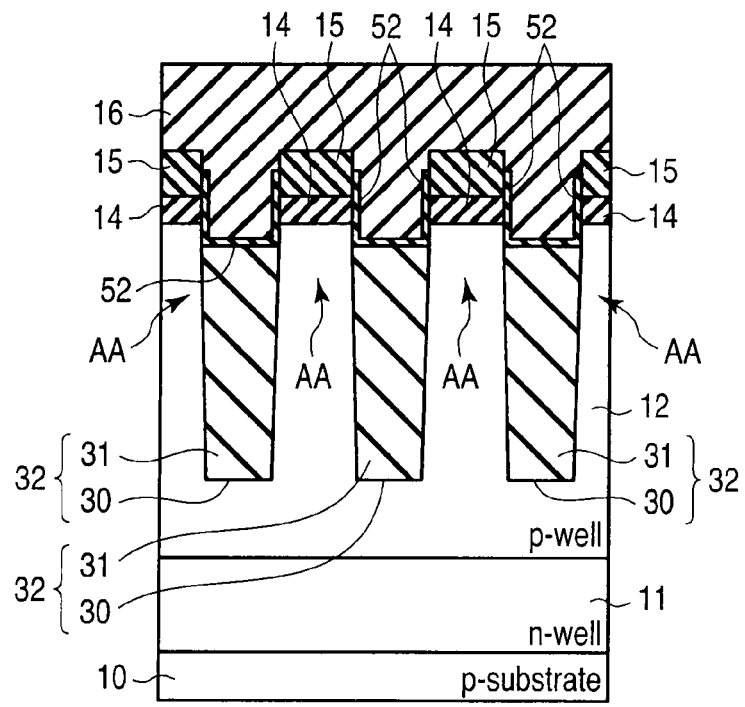
F I G. 30A
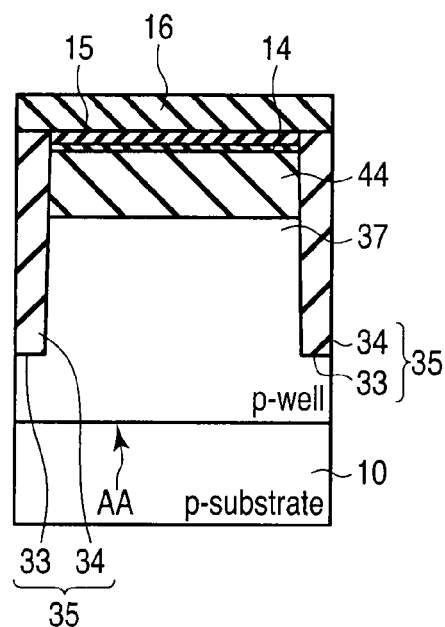
F I G. 30B

SEMICONDUCTOR MEMORY DEVICE INCLUDING LAMINATED GATE HAVING ELECTRIC CHARGE ACCUMULATING LAYER AND CONTROL GATE AND METHOD OF MANUFACTURING THE SAME

CROSS-REFERENCE TO RELATED APPLICATIONS

This application is based upon and claims the benefit of priority from prior Japanese Patent Application No. 2008-141477, filed May 29, 2008, the entire contents of which are incorporated herein by reference.

BACKGROUND OF THE INVENTION

1. Field of the Invention

The present invention relates to a semiconductor memory device and a method of manufacturing the same. For example, the present invention relates to a structure of an element isolation region in a NAND flash memory having a MONOS structure.

2. Description of the Related Art

As a structure of a nonvolatile memory cell transistor in a semiconductor memory device, a conventional MONOS (Metal-Oxide-Nitride-Oxide-Semiconductor) structure is known. The MONOS structure has a structure which has an electric charge accumulating layer (for example, insulating film) formed on a semiconductor substrate through a gate insulating film, an insulating film (to be referred to as a block layer hereinafter) formed on the electric charge accumulating layer and having a dielectric constant higher than that of the electric charge accumulating layer, and a control gate electrode formed on the block layer. This is described on, for example, Pages 110 to 111 in "Self Aligned Trap-Shallow Trench Isolation Scheme For the Reliability of TANOS (TaN/AlO/SiN/Oxide/Si) NAND Flash Memory", by Jae Sung Sim, NVSMW, August 2007.

A semiconductor memory device has an element isolation region which electrically isolates an active region in which a nonvolatile memory cell transistor having a MONOS structure is arranged. An upper surface of the element isolation region is formed at a level higher than that of an upper surface of an electric charge accumulating layer formed on the active region to form a step on an upper surface of a block film formed on the active region and the element isolation region. For this reason, a distance from the upper surface of the control gate to the block layer on the active region is longer than a distance from the upper surface of the control gate on the element isolation region to the block layer. In this state, when a voltage is applied to the control gate, a voltage is not transmitted to the electric charge accumulating layer formed on the active region sufficiently. A higher voltage must be applied to control gate in the conventional structure, for example, to achieve 4 values (2 bits/cell) per cell.

BRIEF SUMMARY OF THE INVENTION

A semiconductor memory device according to an aspect of the present invention includes a first active region and a second active region formed in a semiconductor substrate, respectively;

an element isolation region which is formed in the semiconductor substrate and which isolates the first active region and the second active region from each other; and memory cell transistors which are formed on the first active region and the second active region, respectively and each of which includes a laminated gate and a first impurity diffusion layer functioning as a source and a drain, the laminated gate including a first insulating film which is formed on the semiconductor substrate and which accumulates electric charges, a second insulating film formed on the first insulating film by using a material having a dielectric constant higher than that of the first insulating film, and a control gate electrode formed on the second insulating film, the second insulating film being commonly connected between said plurality of memory cell transistors to step over the element isolation region and being in contact with an upper surface of the element isolation region, and an upper surface of the element isolation region being higher than a bottom surface of the first insulating film and being located under the upper surface of the first insulating film.

A semiconductor memory device manufacturing method according to an aspect of the present invention includes forming a first insulating film which accumulates electric charges on a semiconductor substrate through a gate insulating film;

forming a trench which penetrates partial regions of the gate insulating film and the first insulating film and which has a bottom portion which reaches an inside of the semiconductor substrate;

forming a second insulating film on the first insulating film and in the trench to bury the trench with the second insulating film;

etching the second insulating film such that a position of an upper surface of the second insulating film is lower than an upper surface of the first insulating film to leave the second insulating film in the trench;

forming block layers on the first and second insulating films; and forming a control gate on the block layer.

BRIEF DESCRIPTION OF THE SEVERAL VIEWS OF THE DRAWING

FIG. 1 is a block diagram of a NAND flash memory according to a first embodiment of the present invention;

FIG. 2 is a plan view of a memory cell array included in the NAND flash memory according to the first embodiment of the present invention;

FIG. 5 is a sectional view in a gate length direction of a peripheral transistor included in the NAND flash memory according to the first embodiment of the present invention;

FIGS. 6A to 6D are sectional views showing the first manufacturing step of a semiconductor memory device according to the first embodiment of the present invention, in which FIGS. 6A and 6B show a memory cell transistor and FIGS. 6C and 6D show a peripheral transistor;

FIGS. 7A to 7D are sectional views showing the second manufacturing step of the semiconductor memory device according to the first embodiment of the present invention, in which FIGS. 7A and 7B show a memory cell transistor and FIGS. 7C and 7D show a peripheral transistor;

FIGS. 8A to 8D are sectional views showing the third manufacturing step of a semiconductor memory device according to the first embodiment of the present invention, in which FIGS. 8A and 8B show a memory cell transistor and FIGS. 8C and 8D show a peripheral transistor;

FIGS. 9A to 9D are sectional views showing the fourth manufacturing step of the semiconductor memory device according to the first embodiment of the present invention, in which FIGS. 9A and 9B show a memory cell transistor and FIGS. 9C and 9D show a peripheral transistor;

FIGS. 10A to 10D are sectional views showing the fifth manufacturing step of a semiconductor memory device according to the first embodiment of the present invention, in which FIGS. 10A and 10B show a memory cell transistor and FIGS. 10C and 10D show a peripheral transistor;

FIGS. 11A to 11D are sectional views showing the sixth manufacturing step of the semiconductor memory device according to the first embodiment of the present invention, in which FIGS. 11A and 11B show a memory cell transistor and FIGS. 11C and 11D show a peripheral transistor;

FIGS. 12A to 12D are sectional views showing the seventh manufacturing step of a semiconductor memory device according to the first embodiment of the present invention, in which FIGS. 12A and 12B show a memory cell transistor and FIGS. 12C and 12D show a peripheral transistor;

FIGS. 13A to 13D are sectional views showing the eighth manufacturing step of the semiconductor memory device according to the first embodiment of the present invention, in which FIGS. 13A and 13B show a memory cell transistor and FIGS. 13C and 13D show a peripheral transistor;

FIGS. 14A to 14D are sectional views showing the ninth manufacturing step of a semiconductor memory device according to the first embodiment of the present invention, in which FIGS. 14A and 14B show a memory cell transistor and FIGS. 14C and 14D show a peripheral transistor;

FIGS. 15A to 15D are sectional views showing the tenth manufacturing step of the semiconductor memory device according to the first embodiment of the present invention, in which FIGS. 15A and 15B show a memory cell transistor and FIGS. 15C and 15D show a peripheral transistor;

FIGS. 16A to 16D are sectional views showing the eleventh manufacturing step of a semiconductor memory device according to the first embodiment of the present invention, in which FIGS. 16A and 16B show a memory cell transistor and FIGS. 16C and 16D show a peripheral transistor;

FIGS. 17A to 17D are sectional views showing the twelfth manufacturing step of the semiconductor memory device according to the first embodiment of the present invention, in which FIGS. 17A and 17B show a memory cell transistor and FIGS. 17C and 17D show a peripheral transistor;

FIGS. 18, 19, and 20 are sectional views of memory cell transistors along a word line WL;

FIG. 21 is a graph showing an electric field applied to an electric charge accumulating layer of a memory cell transistor;

FIGS. 24A and 24B are sectional views of a NAND flash memory according to a second embodiment of the present invention, in which FIG. 24A is a sectional view of a memory cell transistor MT along a word line WL and FIG. 24B is a sectional view of a peripheral transistor PT2 along a gate length direction;

FIGS. 25A and 25B are sectional views showing parts of the steps of manufacturing the memory cell transistor and the peripheral transistor PT2 according to the second embodiment of the present invention;

FIGS. 30A and 30B are sectional views showing parts of the steps of manufacturing the memory cell transistor and the peripheral transistor PT2 according to the third embodiment of the present invention.

DETAILED DESCRIPTION OF THE INVENTION

Figure 3:
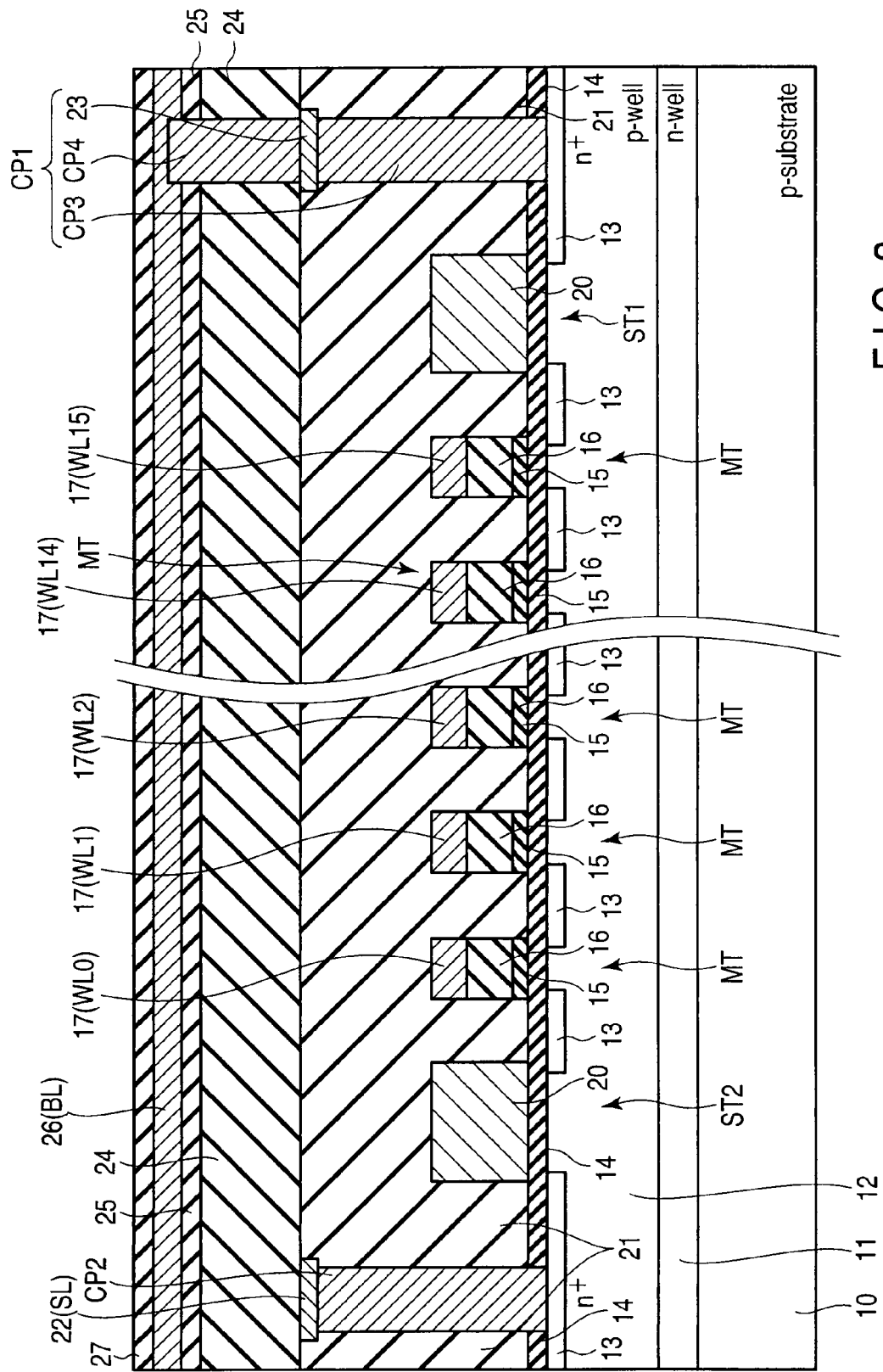
FIG. 3 is a sectional view along a line 3-3 in FIG. 2.

Embodiments of the present invention will be described below with reference to the accompanying drawings. In this explanation, common reference numerals denote common parts over all the drawings.

First Embodiment

A semiconductor memory device according to a first embodiment of the present invention and a method of manufacturing the same will be described below with reference to FIG. 1. FIG. 1 is a block diagram of a NAND flash memory according to the embodiment.

As shown in FIG. 1, the NAND flash memory includes a memory cell array 1, a voltage generating circuit 2, a row decoder 3, and a column decoder 4. First, the memory cell array 1 will be described below.

As shown in FIG. 1, the memory cell array 1 includes a plurality of NAND cells 5 in each of which nonvolatile memory cells are connected in series with each other. Each of the NAND cells 5 includes, for example, 16 memory cell transistors MT and selection transistors ST1 and ST2. The memory cell transistor MT has a MONOS structure having an electric charge accumulating layer (for example, an insulating film) formed on a semiconductor substrate through a gate insulating film, an insulating film (to be referred to as a block layer hereinafter) formed on the electric charge accumulating layer and having a dielectric constant higher than that of the electric charge accumulating layer, and a control gate electrode formed on the block layer. The number of memory cell transistors MT is not limited to 16. The number may be 8, 32, 64, 128, 256, or the like, and is not limited to a specific number. The adjacent memory cell transistors MT share a source and a drain. The memory cell transistors MT are arranged such that the current paths of the memory cell transistors MT are series-connected between the selection transistors ST1 and ST2. A drain region of one end of the series-connected memory cell transistors MT is connected to a source region of the selection transistor ST1, and a source region of the other end is connected to a drain region of the selection transistor ST2.

Control gate electrodes of the memory cell transistors MT on the same row are commonly connected to any one of word lines WL0 to WL15. Gate electrodes of the selection transistors ST1 and ST2 of the memory cells on the same row are commonly connected to select gate lines SGD and SGS, respectively. For descriptive convenience, when the word lines WL0 to WL15 are not discriminated from each other in the following description, the word lines WL0 to WL15 may be simply called word lines WL. Drains of the selection transistors ST1 on the same column in the memory cell array 1 are commonly connected to any one of bit lines BL0 to BLn (n is a natural number). When the bit lines BL0 to BLn are not discriminated from each other, the bit lines BL0 to BLn are referred to as bit lines BL. The sources of the selection transistors ST2 are commonly connected to a source line SL. Both the selection transistors ST1 and ST2 are not always required. Provided the NAND cell 5 can be selected, only one of the selection transistors ST1 and ST2 may be arranged.

FIG. 1 shows only the NAND cells 5 of one row. The NAND cells 5 of a plurality of rows may be arranged in the memory cell array 1. In this case, the NAND cells 5 on the same column are connected to the same bit line BL. Data is written in the plurality of memory cell transistors MT connected to the same word line WL simultaneously, and this unit is called a page. Furthermore, data in the plurality of NAND cells on the same row are erased simultaneously, and this unit is called a memory block.

The row decoder 3 selects a row direction of the memory cell array 1. More specifically, the row decoder 3 selects the word line WL and applies a voltage to the selected word line WL.

The column decoder 4 selects a column direction of the memory cell array 1. More specifically, the column decoder 4 selects the bit line BL.

The voltage generating circuit 2 generates a voltage and supplies the generated voltage to the row decoder 3.

Each of the voltage generating circuit 2, the row decoder 3, and the column decoder 4 include a low-voltage MOS transistor using, for example, a voltage VDD (for example, 1.5 V) as a power supply voltage and a high-voltage MOS transistor using, for example, a voltage VPP (for example, 20 V) higher than the power supply voltage of the low-voltage MOS transistor as a power supply voltage. For descriptive convenience, in the following description, only a p-channel MOS transistor is described as the low-voltage MOS transistor, and only an n-channel MOS transistor is described as the high-voltage MOS transistor. These transistors will be called peripheral transistors PT1 and PT2, respectively.

A plan view of the memory cell array 1 having the above configuration will be described below by using FIG. 2. FIG. 2 is a plan view of the memory cell array 1.

As shown in FIG. 2, in a p-type semiconductor substrate 10, a plurality of strip-like element regions AA in a first direction are arranged in a second direction, orthogonal to the first direction. An element isolation region 32 (expressed by STI in FIG. 2) is formed between adjacent element regions AA. The element regions AA are electrically isolated from each other by the element isolation region 32. On the p-type semiconductor substrate 10, a strip-like word line WL and the select gate lines SGD and SGS in the second direction are formed to step over the plurality of element regions AA. An electric charge accumulating layer 15 is arranged in a region in which the word line WL and the element region AA cross. The memory cell transistor MT is arranged in a region in which the word line WL and the element region AA cross, and the selection transistors ST1 and ST2 are arranged in the regions in which the select gate lines SGD and SGS and the element region AA cross, respectively. In the element regions AA between the word lines WL adjacent to each other in the first direction, between the select gate lines adjacent to each other in the first direction, and between the word line WL and the select gate line, impurity diffusion layers serving as the source regions or the drain regions of the memory cell transistor MT and the selection transistors ST1 and ST2 are formed.

An impurity diffusion layer formed in the element region AA between the select gate lines SGD adjacent to each other in the first direction functions as a drain region of the selection transistor ST1. A contact plug CP1 is formed on the drain region. The contact plug CP1 is connected to the strip-like bit lines BL (not shown) arranged along the first direction. The impurity diffusion layer formed in the element region AA between the select gate lines SGS adjacent to each other in the first direction functions as a source region of the selection transistor ST2. On the source region, a contact plug CP2 is formed. The contact plug CP2 is connected to a source line SL (not shown).

A sectional configuration of the memory cell array 1 having the above configuration will be described below with reference to FIG. 3 and FIG. 4. FIG. 3 is a sectional view of the NAND cell 5 along a 3-3 line in FIG. 2, and FIG. 4 shows a sectional view of the NAND cell 5 along a 4-4 line in FIG. 2.

Figure 4:
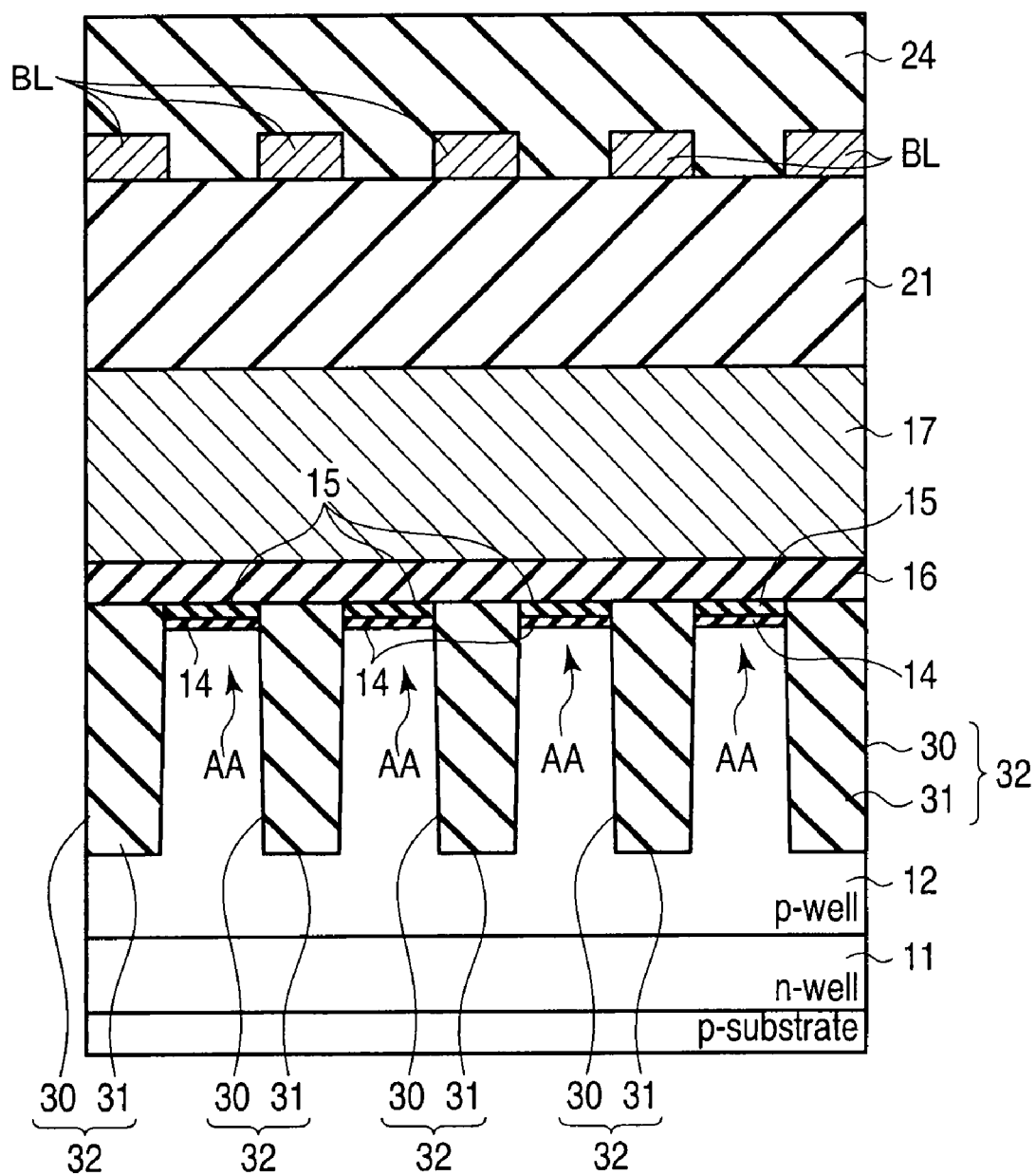
FIG. 4 is a sectional view along a line 4-4 in FIG. 2.

As shown in FIGS. 3 and 4, an n-type well region 11 is formed in a surface region of the p-type semiconductor substrate 10, and a p-type well region 12 is formed on the n-type well region 11. In the p-type well region 12, along the second direction, a plurality of trenches 30 are formed. In the trenches 30, an insulating film 31 is buried by using, for example, a silicon oxide film. The trenches 30 and the insulating film 31 constitute element isolation regions 32. A region between the adjacent element isolation regions 32 serves as an active region AA. The adjacent active regions AA are isolated by the element isolation region 32. On the active region AA, a gate insulating film 14 constituted by, for example, a silicon oxide film and serving as a gate insulating film is formed. On the gate insulating film 14, a gate electrode of the memory cell transistor MT and the selection transistors ST1 and ST2 are formed. The gate insulating film 14 on the memory cell transistor MT functions as a tunnel film through which electrons tunnel.

The gate electrode of the memory cell transistor MT has a laminated structure. More specifically, the gate electrode includes the insulating film 15 formed on the gate insulating film 14, an insulating film 16 formed on the insulating film 15, and a polycrystalline silicon layer 17 formed on the insulating film 16. The insulating film 15 functions as an electric charge accumulating layer which accumulates electric charges. The insulating film 16 functions as a block layer to confine electric charges in the insulating film 15 and is formed by using a material having a dielectric constant higher than that of the material used in the insulating film 15. The polycrystalline silicon layer 17 functions as a control gate (word line WL). In the following description, the insulating films 15 and 16 and the polycrystalline silicon layer 17 in the memory cell transistor MT may be called the electric charge accumulating layer 15, the block layer 16, and the control gate 17, respectively. An upper part or the whole of the polycrystalline silicon layer 17 may be silicified to make the resistance of the word line low. The electric charge accumulating layers 15 are separated in units of memory cell transistors MT, and the block layer 16 and the control gate 17 are commonly connected between the memory cell transistors MT adjacent in a word line direction. More specifically, the block layers 16 of the memory cell transistors MT are commonly connected between the adjacent active regions AA to step over the adjacent element isolation region 32 in a direction along the word lines.

The electric charge accumulating layer 15 is formed to have an upper surface which has a level equal to that of the upper surface of the element isolation region 32. A surface with which the bottom surface of the block layer 16 on the element isolation region 32 and the upper surface of the element isolation region 32 are in contact has a level which is equal to that of the upper surface of the electric charge accumulating layer 15 on the active region AA, i.e., the surface and the upper surface of the electric charge accumulating layer 15 are on the same plane.

The gate electrodes of the selection transistors ST1 and ST2 include the polycrystalline silicon layers 20. Hereinafter, the polycrystalline silicon layer 20 may be called a gate electrode 20. An upper part or the whole of the polycrystalline silicon layer 20 may be silicified to make the resistance of the gate electrode low. In the selection transistors ST1 and ST2, the gate electrodes 20 which are adjacent to each other in the second direction are commonly connected to each other. The gate electrodes 20 function as the select gate lines SGS and SGD.

An $n^+$-type impurity diffusion layer 13 is formed in the surface of the p-type semiconductor substrate 10 located between the gate electrodes. The $n^+$-type impurity diffusion layer 13 is shared by adjacent transistors, and functions as a source (S) or a drain (D). A region (immediately under the gate electrode) between the source and the drain which are adjacent to each other functions as a channel region serving as an electron moving region. The gate electrode, the $n^+$-type impurity diffusion layer 13, and the channel region constitute the memory cell transistor MT and the selection transistors ST1 and ST2.

Furthermore, an interlayer insulating film 21 is formed on the p-type semiconductor substrate 10 to cover the memory cell transistor MT and the selection transistors ST1 and ST2. In the interlayer insulating film 21, the contact plug CP2 which reaches the impurity diffusion layer (source) 13 of the selection transistor ST2 on the source side is formed. On the surface of the interlayer insulating film 21, a metal wiring layer 22 connected to the contact plug CP2 is formed. The metal wiring layer 22 functions as a part of the source line SL. In the interlayer insulating film 21, a contact plug CP3 which reaches the impurity diffusion layer (drain) 13 of the selection transistor ST on the drain side is formed. On the surface of the interlayer insulating film 21, a metal wiring layer 23 connected to the contact plug CP3 is formed.

On the interlayer insulating film 21, an interlayer insulating film 24 is formed by using, for example $SiO_2$ as a material. An insulating film 25 is formed on the interlayer insulating film 24. The insulating film 25 is formed by using a material, for example, SiN having a dielectric constant higher than that of the interlayer insulating film 24. A metal wiring layer 26 is formed on the insulating film 25. The metal wiring layer 26 functions as the bit line BL. In the insulating film 25 and the interlayer insulating film 24, a contact plug CP4 which is in contact with the metal wiring layer 26 on the upper surface and which is in contact with the metal wiring layer 23 on the bottom surface is formed. The upper surface of the contact plug CP4 is higher than the upper surface of the insulating film 25. More specifically, an upper part of the contact plug CP4 is formed to be buried in the metal wiring layer 26. The contact plug CP3, the metal wiring layer 23, and the contact plug CP4 function as contact plugs CP1 in FIG. 2. An interlayer insulating film 27 is formed on the insulating film 25 and the metal wiring layer 26 by using a material, for example, $SiO_2$ having a dielectric constant lower than that of the insulating film 24. The interlayer insulating film 27 buries a region between the adjacent bit lines BL.

A structure of peripheral transistors PT1 and PT2 included in the voltage generating circuit 2, the row decoder 3, and the column decoder 4 will be described below with reference to FIG. 5. FIG. 5 is a sectional view of the peripheral transistors PT1 and PT2, and shows a section in a gate length direction (direction in which a source, a channel, and a drain are sequentially ordered).

As shown in FIG. 5, a plurality of element regions AA are formed in the p-type semiconductor substrate 10. The element regions AA are surrounded by an element isolation region 35. The adjacent element regions AA are isolated from each other by the element isolation region 35. The element isolation region 35 is formed to have a trench 33 formed in the p-type semiconductor substrate 10 and a silicon oxide film 34 buried in the trench 33. In the surfaces of the element regions AA isolated by the element isolation region 35, an n-type well region 36 and a p-type well region 37 are formed, respectively. On the n-type well region 36 and the p-type well region 37, the peripheral transistors PT1 and PT2 are formed, respectively.

The peripheral transistor PT1 will be described first. As shown in FIG. 5, on the well region 36, a gate insulating film 42 constituted by, for example, a silicon oxide film and functioning as a gate insulating film is formed. On the gate insulating film 42, the gate electrode 43 of the peripheral transistor PT1 is formed by using, for example, a polycrystalline silicon layer as a material. In the surface of the well region 36, a $p^+$-type impurity diffusion layer 41 functioning as a source or a drain is formed. A region between the source and the drain functions as a channel region serving as an electron moving region. With the above configuration, the peripheral transistor PT1 is formed.

The peripheral transistor PT2 will be described next. As shown in FIG. 5, on the well region 37, a gate insulating film 44 constituted by, for example, a silicon oxide film and functioning as a gate insulating film is formed. On the gate insulating film 44, the gate electrode 43 of the peripheral transistor PT2 is formed by using, for example, a polycrystalline silicon as a material. The gate electrode 43 of the peripheral transistor PT2 has the same structure as that of the gate electrode 43 of the peripheral transistor PT1. In the surface of the p-type semiconductor substrate 10, an $n^+$-type impurity diffusion layer 39 functioning as a source or a drain is formed. A region between the source and the drain functions as a channel region serving as an electron moving region. With the above configuration, the peripheral transistor PT2 is formed. The gate insulating film 42 has a thickness smaller than that of the gate insulating film 44. This is because a voltage higher than that applied to the gate electrode 43 of the peripheral transistor PT1 is applied to that of the peripheral transistor PT2.

On the p-type semiconductor substrate 10, the interlayer insulating films 21 and 24 are formed to cover the peripheral transistors PT1 and PT2. In the interlayer insulating films 21 and 24, a contact plug and a metal wiring layer (not shown) are formed. Voltages are applied to the peripheral transistors PT1 and PT2 through the contact plug and the metal wiring layer.

A method of manufacturing the memory cell transistor MT and the peripheral transistors PT1 and PT2 will be described below with reference to FIGS. 6A to 6D to FIGS. 17A to 17D. FIGS. 6A to 6D to FIGS. 17A to 17D are sectional views sequentially showing the manufacturing steps of the memory cell transistor MT and the peripheral transistors PT1 and PT2. FIGS. 6A to 17A show sections of the memory cell transistor MT in the direction of the bit lines BL, FIGS. 6B to 17B show sections of the memory cell transistor MT in the direction of the word lines WL, FIGS. 6C to 17C show sections of low-voltage peripheral transistor PT1 in a gate length direction, and FIGS. 6D to 17D show sectional configurations of a high-voltage peripheral transistor PT2 in the gate length direction.

Figures 6A, 6B, 6C, 6D:
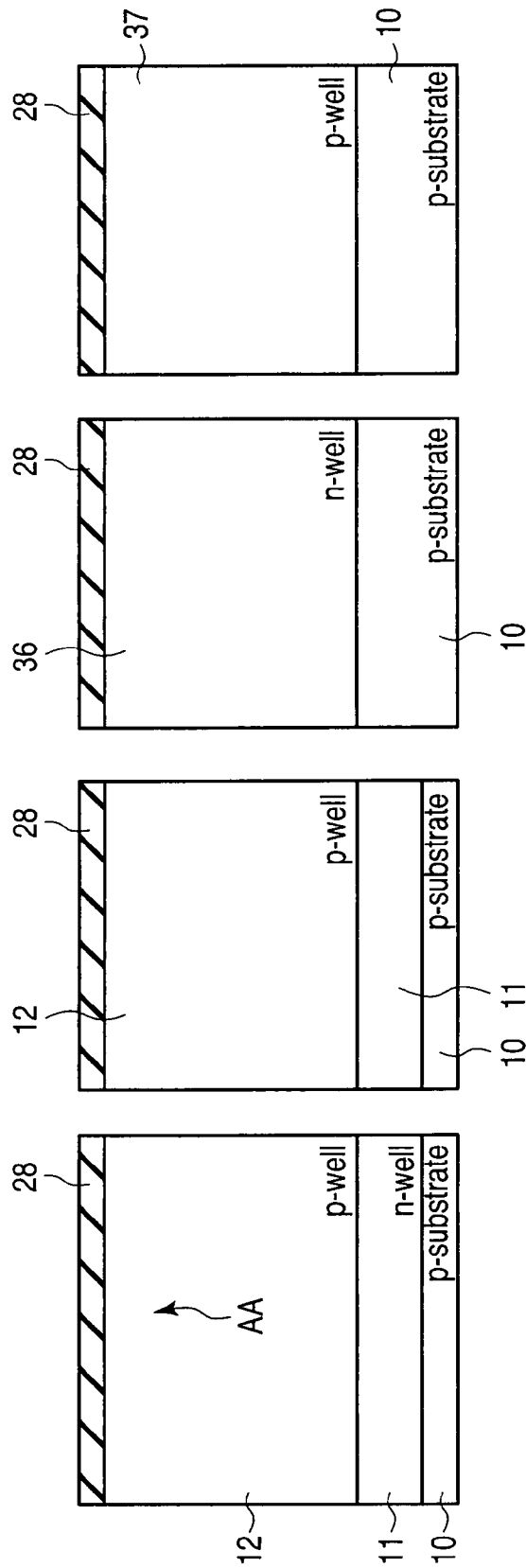

As shown in FIGS. 6A to 6D, the surface of the p-type semiconductor substrate 10 is oxidized to form a sacrificial oxide film 28 having a thickness of, for example, about 10 [nm]. A region except for a prediction region for forming the peripheral transistor PT1 shown in FIG. 6C, i.e., in FIGS. 6A, 6B, and 6D, a photoresist film (not shown) is formed by using a photolithography technique. Thereafter, predetermined amount of, for example, phosphorous ions are injected on the p-type semiconductor substrate 10 with a predetermined acceleration voltage. With this injection, as shown in FIG. 6C, the n-type well region 36 is formed on the p-type semiconductor substrate 10. After the photoresist film is peeled by wet etching, in a region except for a prediction region for forming the peripheral transistor PT2 shown in FIG. 6D, i.e., in FIGS. 6A to 6C, a photoresist film is formed by using a photolithography technique. Thereafter, predetermined amount of, for example, boron ions are injected on the p-type semiconductor substrate 10 in the prediction region for forming the peripheral transistor PT2 with a predetermined acceleration voltage to form the p-type well region 37 shown in FIG. 6D. As described above, the peripheral transistor PT1 is a low-voltage transistor, and the peripheral transistor PT2 is a high-voltage transistor to which a voltage higher than that of the peripheral transistor PT1 is applied. In formation of the n-type well region 36 and the p-type well region 37, concentrations of the channel are decided to depend on purposes (breakdown voltages) of the peripheral transistor PT1 and the peripheral transistor PT2. For this reason, as needed, the photolithography step, the ion injection step, and the photoresist peeling step are repeated.

The photoresist film is removed, and another photoresist film (not shown) is formed in a region except for a prediction region for forming the memory cell transistor MT shown in FIGS. 6A and 6B by the photolithography step. Predetermined amount of, for example, phosphorous ions are injected into the p-type semiconductor substrate 10 with a predetermined acceleration voltage. With this injection, the n-type well region 11 is formed on the upper surface of the p-type semiconductor substrate 10. Subsequently, a predetermined number of, for example, boron ions are injected into the surface of the n-type well region 11 with a predetermined acceleration voltage. With this injection, the p-type well region 12 is formed on the surface of the n-type well region 11. Thereafter, the photoresist film is removed by wet etching.

As shown in FIGS. 7A to 7D, the sacrificial oxide film 28 formed in FIGS. 6A to 6D is removed. Thereafter, the gate insulating film 44 is formed for the peripheral transistor PT2 in FIG. 7D by the oxidizing step. Furthermore, a photoresist film (not shown) is formed on only the peripheral transistor PT2 by the photolithography step. The gate insulating film 28 simultaneously formed in the oxidizing step in FIGS. 7A to 7C is removed to obtain FIGS. 7A to 7D.

On the p-type well region 12, the n-type well region 36, and the gate insulating film 44 shown in FIGS. 8A to 8D, the gate insulating film 14 having a thickness of, for example, 2 [nm] to 6 [nm] is formed. As the material of the gate insulating film 14, for example, an $SiO_2$ film or an oxynitride film formed by using $NH_3$ or a NO nitride is used. The gate insulating film 14 may be a laminated film containing a plurality of materials, for example a structure expressed by $SiO_2/Si/SiO$ or a structure expressed by $SiO_2/Si/SiO_2$. When the laminated film is used, a tunnel current in a data write state or a data erase state can be increased. The gate insulating film 14 may have a laminated structure including not only the above materials but also any one of $SiO_2$, SiN, Si fine particles, and $Al_2O_3$. More specifically, a structure expressed by $SiO_2/SiN/SiO_2$, a structure expressed by $SiO_2/Si$ fine particle/$SiO_2$, or a structure expressed by $SiO_2/Al_2O_3/SiO_2$ may be used. With this configuration, data write and erase rates can be increased, and a low-voltage operation can be realized.

Figures 8A, 8B, 8C, 8D:
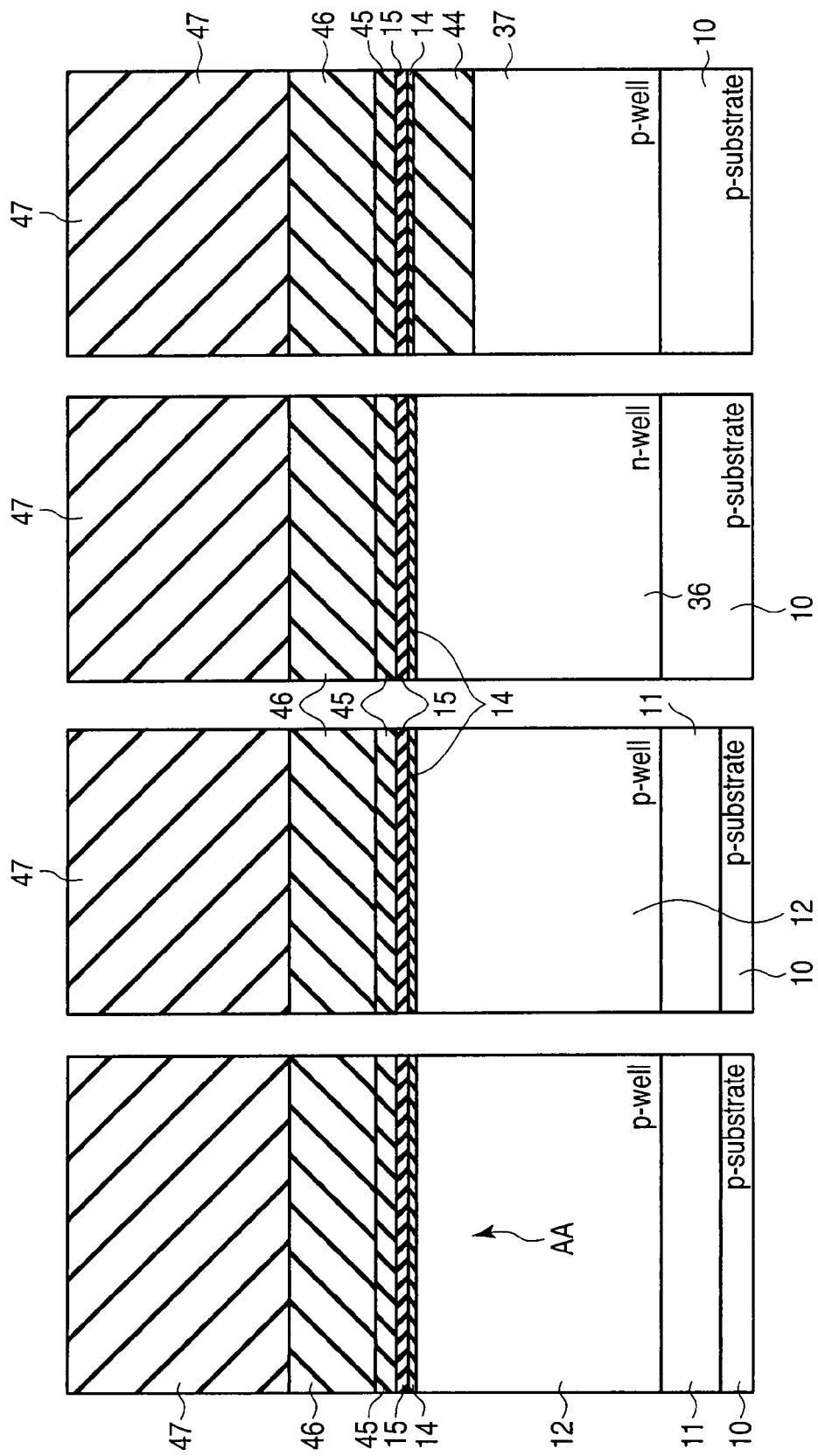
Figures 9A, 9B, 9C, 9D:
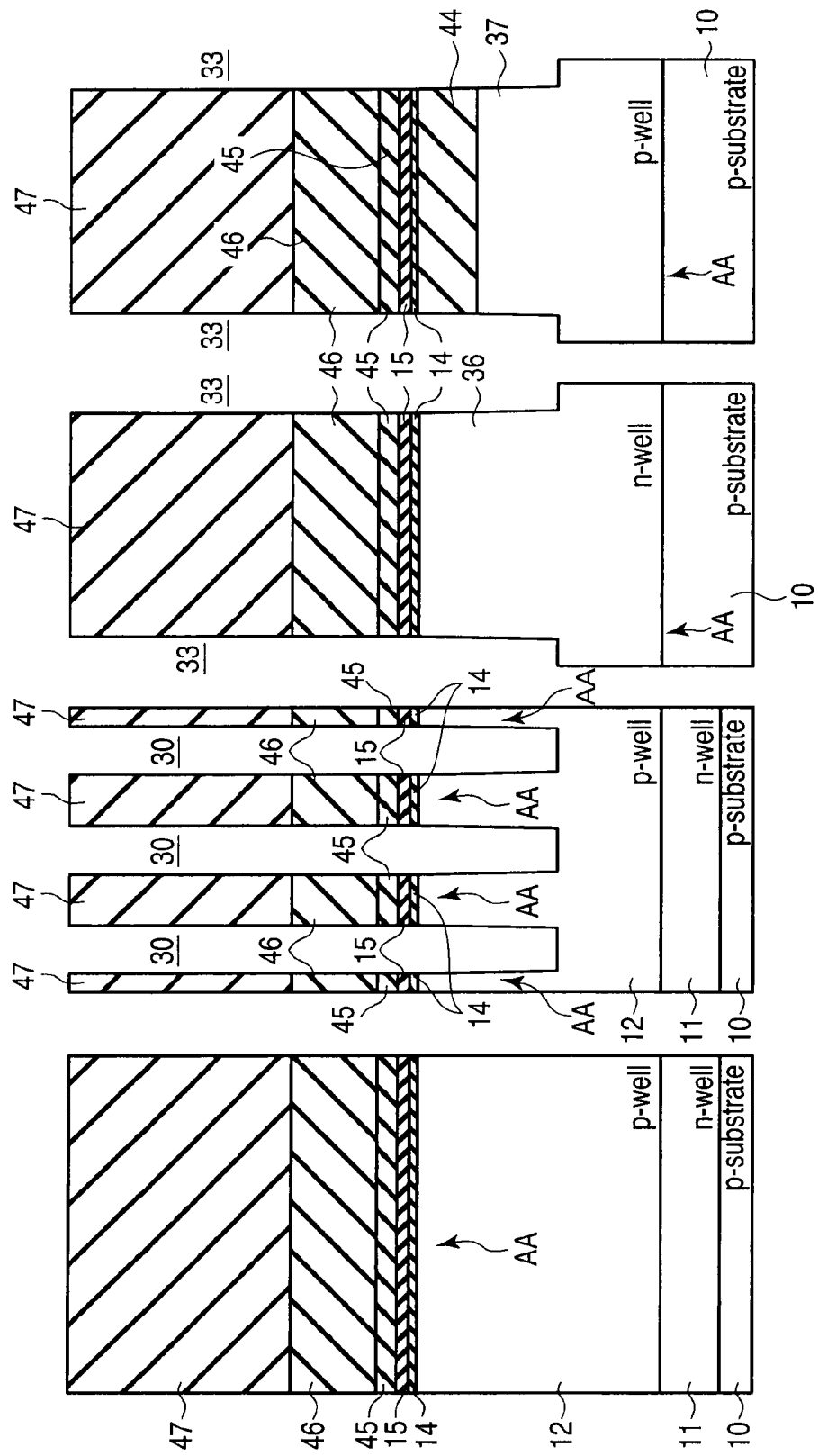

When the gate insulating film 14 including the same material as that of the gate insulating film 44 is formed, a boundary between the gate insulating film 44 and the gate insulating film 14 shown in FIG. 8D is not formed.

Furthermore, on the gate insulating film 14, the insulating film 15 serving as an electric charge accumulating layer is formed to have a thickness of, for example, 3 [nm] to 10 [nm]. The insulating film 15 has, for example, an SiN single film, an HfAlO single film, or a laminated structure containing any one of SiN, HfAlO, and $Al_2O_3$. Furthermore, on the insulating film 15, a buffer silicon oxide film 45 having a thickness of about 10 [nm] is formed by a CVD (Chemical Vapor Deposition) method. Subsequently, an SiN film 46 having a film thickness of, for example, about 50 [nm] is formed on the buffer silicon oxide film 45. Furthermore, for example, a BSG film 47 which functions as a mask material in formation of the element isolation region 32 is formed on the SiN film 46.

Furthermore, on the BSG film 47, in a region except for a prediction region for forming the element isolation region 32, a photoresist film (not shown) is formed by the photolithography step. The BSG film 47 is etched by using anisotropic etching in a region in which the photoresist film is not formed, i.e., the photoresist film is open. Subsequently, the SiN film 46, the buffer silicon oxide film 45, the insulating film 15, and the gate insulating film 14 are etched by anisotropic etching. By the above steps, as shown in FIGS. 9A to 9D, trenches 30 and 33 having bottom portions reaching the inside of the semiconductor substrate 10 are completed.

As shown in FIGS. 10A to 10D, the photoresist film and the BSG film 47 formed on the BSG film 47 are removed. In the trenches 30 and 33, for example, silicon oxide film 31 and 34 are buried, respectively. At this time, the silicon oxide films 31 and 34 are also formed on the SiN film 46. For example, the silicon oxide films 31 and 34 may be the same films formed in the same step. Thereafter, the silicon oxide films 31 and 34 are polished by a CMP (Chemical Mechanical Polishing) method or the like using the SiN film 46 as a stopper to flatten the upper surfaces of the silicon oxide films 31 and 34 and leave the silicon oxide films 31 and 34, and silicon oxide films 31 and 34 exist in only the trenches 30 and 33. With the above steps, the element isolation regions 32 and 35 having the trenches 30 and 33 and the silicon oxide films 31 and 34 buried in the trenches 30 and 33 are completed.

Figures 11A, 11B, 11C, 11D:
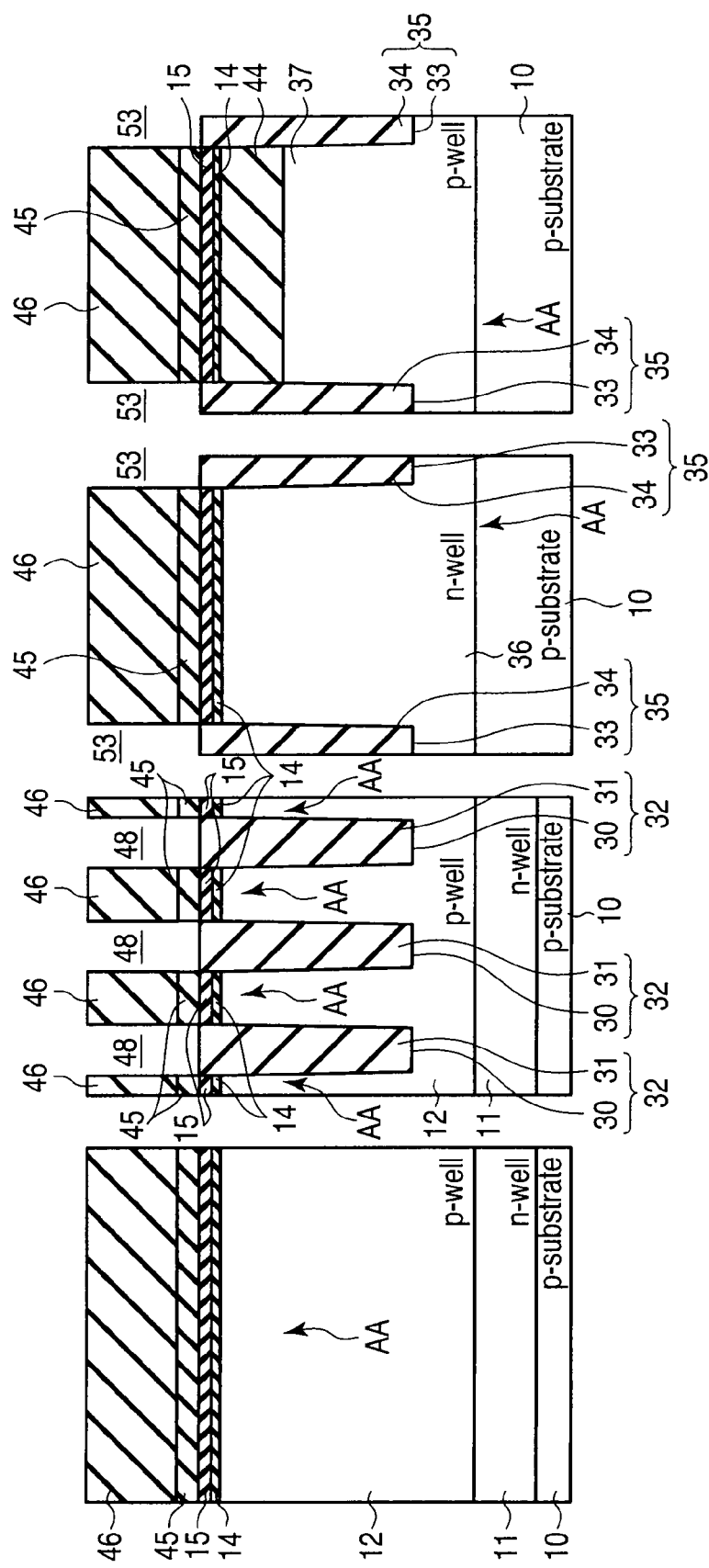
Figures 13A, 13B, 13C, 13D:
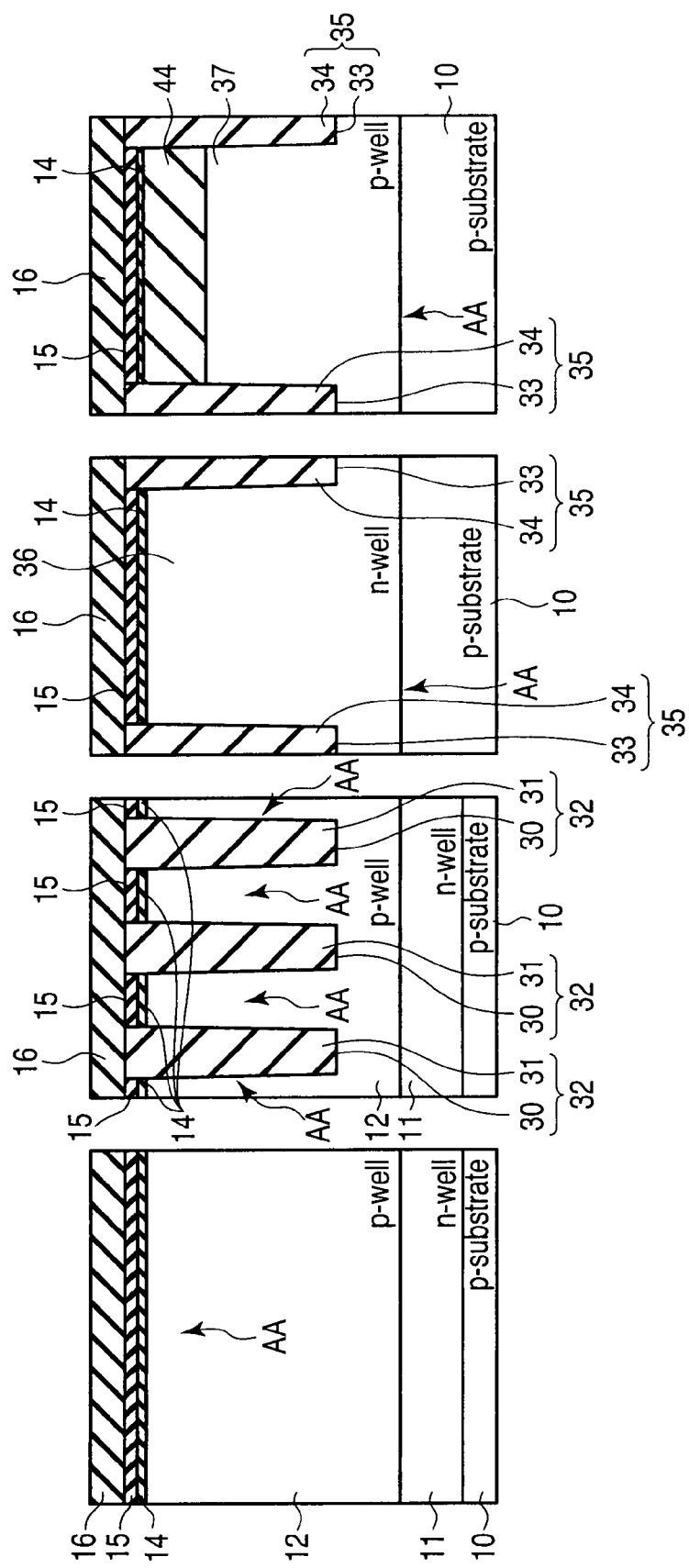
Figures 16A, 16B, 16C, 16D:
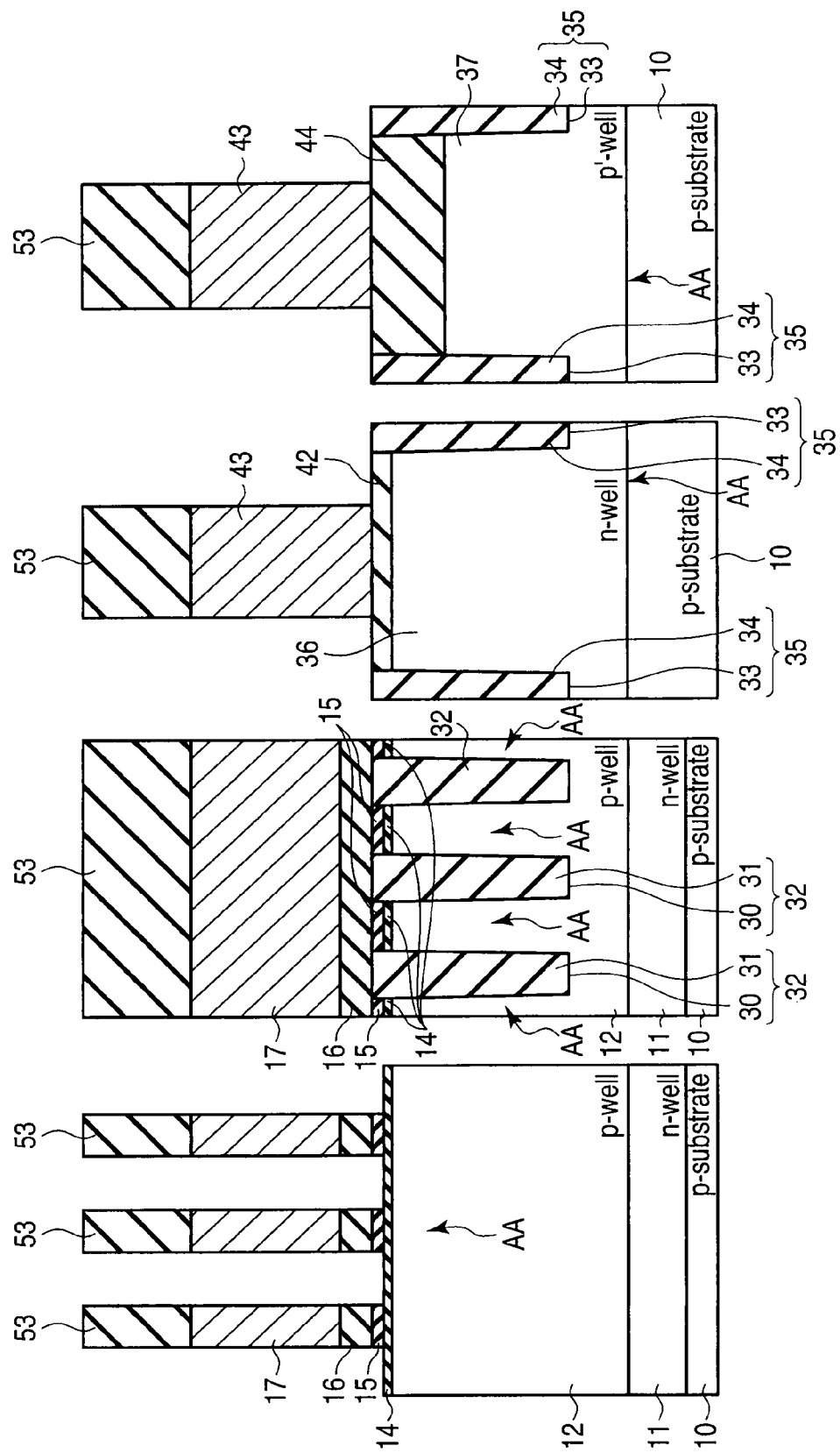

As shown in FIGS. 11A to 11D, for example, the upper surfaces of the element isolation region 32 and the element isolation region 35 are removed by dry etching. More specifically, the upper surfaces of the silicon oxide films 31 and 34 in the trenches 30 and 33 are lowered (recessed). At this time, etching amounts are adjusted such that the upper surfaces of the insulating film 15 and the silicon oxide film 31 are aligned to each other. By the dry etching, as shown in FIG. 11B, the upper surface of the element isolation region 32 and the upper surface of the insulating film 15 are made to have the same level. As a result, a trench 48 is formed. As shown in FIGS. 11C and 11D, the same steps are also performed on the peripheral transistors PT1 and PT2. More specifically, the upper surface of the silicon oxide film 34 inside the trench 33 is recessed. However, in the peripheral transistors PT1 and PT2, the level of the element isolation region 35 may be higher than the level of the element isolation region 32 shown in FIG. 11B. This is to prevent a withstand-voltage defect between the gate electrode 43 and the p-type semiconductor substrate 10. In this case, when the upper portion of the element isolation region 32 is to be etched, the element isolation region 35 is covered with a resist mask or the like to prevent the element isolation region 35 from being etched.

Thereafter, as shown in FIGS. 12A to 12D, the SiN film 46 and the buffer silicon oxide film 45 are removed by, for example, wet etching. As shown in the drawings, the upper surface of the insulating film 15, the upper surface of the element isolation region 32, and the upper surface of the element isolation region 35 are aligned to each other.

As shown in FIGS. 13A to 13D, the insulating film 16 having a thickness of, for example, 10 [nm] to 20 [nm] is formed on the insulating film 15, the element isolation region 32, and the element isolation region 35. The insulating film 16 serves as a block layer, and is constituted by, for example, an $Al_2O_3$ single film or an LaAlO single film, or the like. The block layer functions to prevent electrons injected from the p-type semiconductor substrate 10 from leaking to the gate electrode when a voltage is applied to the gate electrode in a programming state. Furthermore, in an erase state, electrons are prevented from the gate electrode into the electric charge accumulating layer. For this reason, the insulating film 16 serving as the block layer is constituted by, for example, the above material having a relative dielectric constant higher than that of the insulating film 15.

A photoresist film (not shown) is formed by the photolithography step on the block layer 16 in a prediction region for forming the memory cell transistor MT shown in FIGS. 14A and 14B. After the photoresist film is formed, the insulating films 15 and 16 and the gate insulating film 14 in the prediction regions for forming the peripheral transistors PT1 and PT2 shown in FIGS. 14C and 14D are removed, for example, by dry etching or wet etching. Thereafter, the photoresist film is removed.

As shown in FIG. 15C, the gate insulating film 42 on the n-type well region 36 is formed to have a film thickness of, for example, about 8 [nm]. Thereafter, on the insulating film 16 and the gate insulating films 42 and 44, a polycrystalline silicon layer 49 is formed to have a thickness of, for example, about 70 [nm]. Furthermore, an SiN film 53 serving as a mask material is formed on the polycrystalline silicon layer 49.

By the photolithography step and the dry etching step, the SiN film 53, the polycrystalline silicon layer 49, and the insulating film layers 15 and 16 are patterned into patterns of gate electrodes to obtain configurations shown in FIGS. 16A to 16D. More specifically, in the prediction region (FIGS. 16A and 16B) for forming the memory cell transistor MT, a laminated gate including the electric charge accumulating layer formed by the insulating film 15, the block layer formed by the insulating film 16, and the control gate (to be referred to as the control gate 17 hereinafter) formed by the polycrystalline silicon layer 49 is completed.

In the prediction regions for forming the peripheral transistors PT1 and PT2, the gate electrode 43 formed by the polycrystalline silicon layer 49 is completed. The gate electrodes of the selection transistors ST1 and ST2 are formed to have the same configurations as those of the gate electrodes of the peripheral transistors PT1 and PT2. On the control gate 17 and the gate electrode 43, the mask material is left. The control gate 17 may have a laminated structure containing, for example, TaN, WN, and W. The control gates 43 of the peripheral transistors PT1 and PT2 may also have laminated structures containing, for example, polycrystalline silicon, TaN, WN, and W.

Figures 17A, 17B, 17C, 17D:
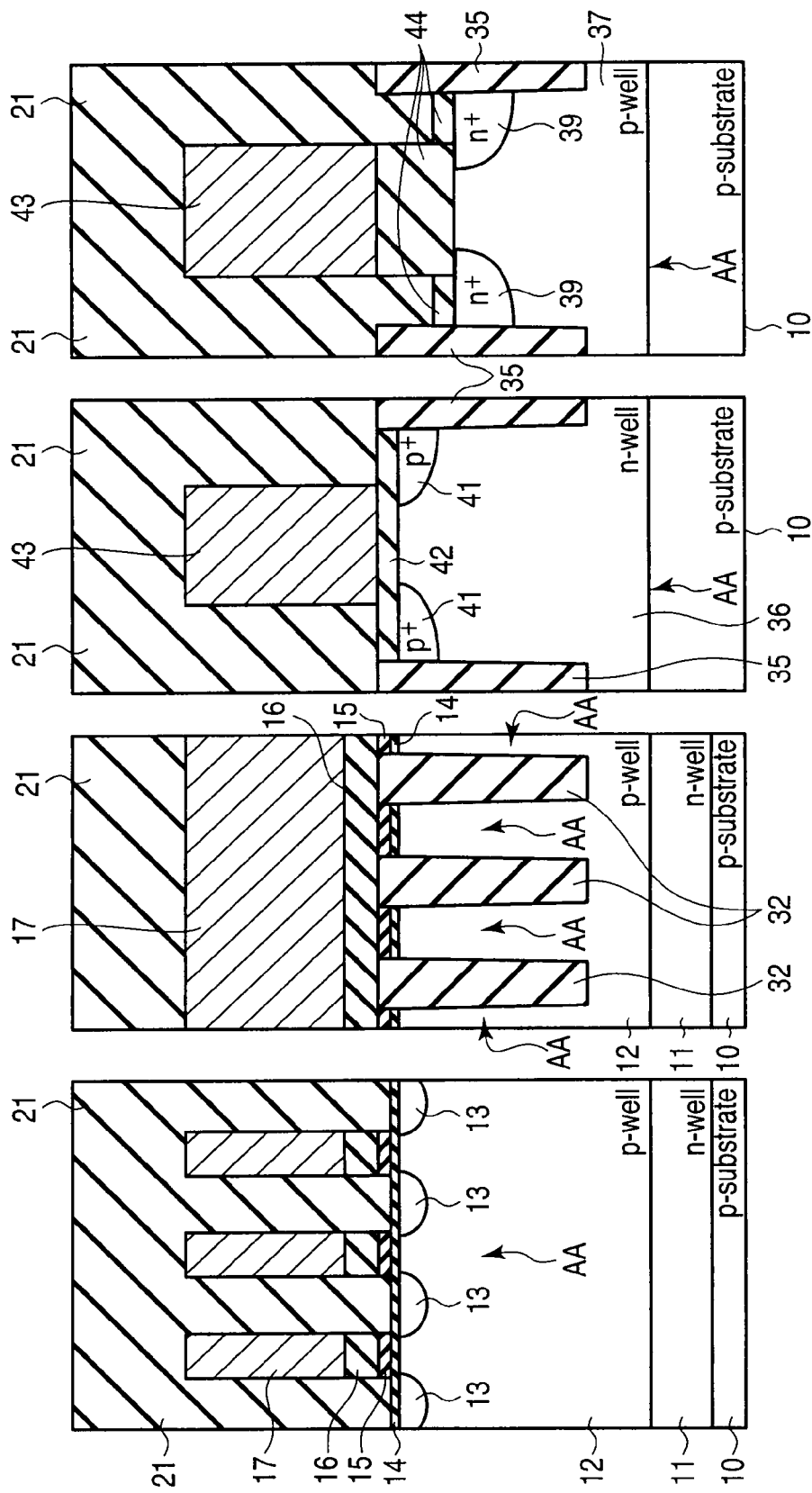

As shown in FIG. 17D, in the peripheral transistor PT2, an upper portion of the gate insulating film 44 located immediately above the prediction region for forming the source and the drain is partially etched to decrease the film thickness of the gate insulating film 44 in the region. This step can be performed by anisotropic etching using the SiN film 53 or the gate electrode 43 as a mask. When an upper surface of the element isolation region 35 is not covered with the mask material or the like, an upper portion of the element isolation region 35 is etched. For this reason, the element isolation region 35 is advantageously covered with a resist mask or the like to prevent the element isolation region 35 from being etched when the upper portion of the element isolation region 32 is etched. By this step, in ion injection performed to form the source and the drain, sufficient amount of ions can be injected into the well region 37.

Thereafter, by using the photolithography step and the ion injection step, an impurity is injected into the well regions 12, 36, and 37 to form the impurity diffusion layers 13, 39, and 41 functioning as the source and the drain. The ion injection step is performed by using an injection amount, ion species, and an acceleration voltage which are appropriate for the transistors. After the impurity is injected, annealing is performed at, for example, a temperature of 950° C. to activate the injected impurity. As a result of the ion injection and the annealing, the sources and drains 13, 39, and 41 of the memory cell transistor MT and the peripheral transistors PT1 and PT2 are completed.

Furthermore, the SiN film 53 on the gate electrode is removed by dry etching or like. Subsequently, the surfaces of the gate electrodes 17 and 43 are silicified. For example, an Ni layer is formed on the gate electrodes 17 and 43 and annealed to form NiSi on the upper surfaces of the gate electrodes 17 and 43.

On the p-type semiconductor substrate 10, the interlayer insulating film 21 is formed to cover the memory cell transistor MT and the peripheral transistors PT1 and PT2. On the interlayer insulating film 21, the contact plugs CP1 and CP2 having the same characteristics as those of a high-melting point metal such as tungsten or molybdenum or a metal wiring layer using, for example, aluminum are formed. In this state, the memory cell transistor MT and the peripheral transistors PT1 and PT2 shown in FIGS. 2 to 4 can be obtained.

FIGS. 9A to 17A show the three memory cell transistors MT connected to, for example, WL0 to WL2 especially in FIG. 3. FIGS. 9B to 17B show the three element isolation regions 32 and the four active regions AA especially in FIG. 4.

Voltages are applied to the memory cell transistors MT and the peripheral transistors PT1 and PT2 through the contact plugs and the metal wiring layer.

As described above, according to a semiconductor memory device according to the first embodiment and a method of manufacturing the semiconductor memory device, operational reliability can be improved. This effect will be described below in detail in comparison with a conventional semiconductor memory device.

<Conventional Configuration>

Figure 18:
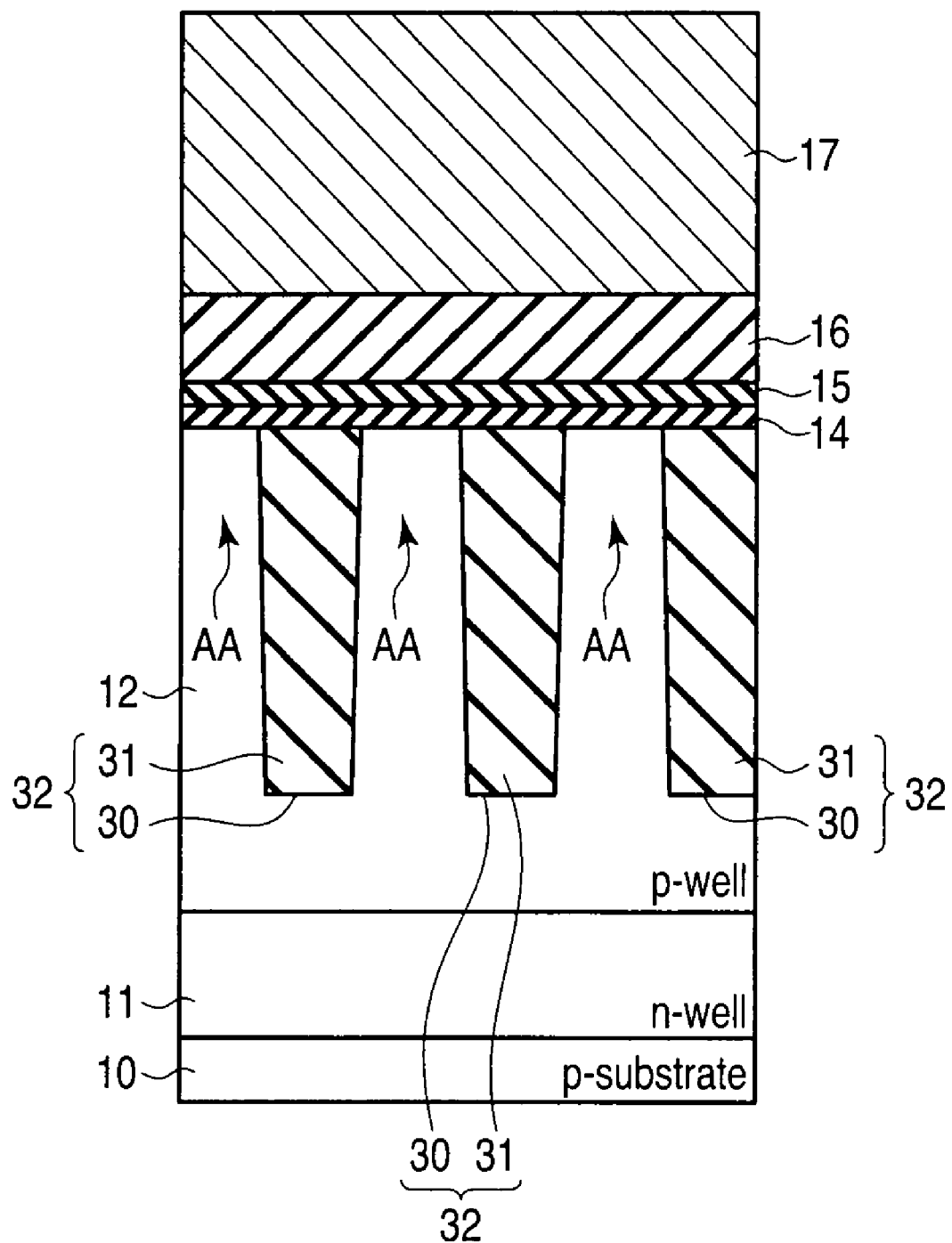

FIG. 18 is a sectional view of a memory cell array included in a conventional NAND flash memory in a direction of word lines. The same reference numerals as in the embodiment denote the same parts in the memory cell array. As shown in FIG. 18, with the conventional configuration, the electric charge accumulating layers 15 of the memory cell transistors MT adjacent to each other in the direction of word line WL are commonly connected to each other to step over the element isolation region 32. For this reason, the following problem may be posed.

<<Problem 1>>

More specifically, electrons captured in the electric charge accumulating layer 15 by a data programming operation move in the electric charge accumulating layer. That is, in the electric charge accumulating layer 15, electrons injected in a region on the active region AA moves to a region on the element isolation region 32. This is because an electric field is generated by the Frenkel Poll phenomenon. As a result, the number of electrons in the region on the active region AA decreases, and a threshold value of the memory cell transistor MT decreases. This may cause an erroneous operation of the memory cell transistor MT.

In particular, when the area of the electric charge accumulating layer 15 decreases with shrinking of the memory cell transistor MT, the above phenomenon becomes conspicuous. For this reason, this problem hinders miniaturization of a NAND flash memory and a reduction in cost.

COMPARATIVE EXAMPLE

As a countermeasure against this problem, a structure shown in FIG. 19 may be conceived. FIG. 19 is a sectional view of a memory cell array included in a NAND flash memory in a direction of word lines. The same reference numerals as in the embodiments denote the same members in the memory cell array. In FIG. 19, reference symbols "p1" and "p2" denote positions of ends of the electric charge accumulating layer 15 in a direction along the word lines WL. That is, at the positions "p1" and "p2", the electric charge accumulating layer 15 is in contact with the element isolation region 32.

As shown in the drawing, a configuration in FIG. 19 has a configuration in which the electric charge accumulating layer 15 and the block layer 16 of the memory cell transistors MT adjacent to each other in the direction along the word lines WL are isolated by the element isolation region 32. In other words, the upper surface of the element isolation region 32 is located in the control gate 17, the element isolation region 32 penetrates the block layer 16 and the electric charge accumulating layer 15. With this configuration, electrons in the electric charge accumulating layer 15 can be prevented from moving to a region except for the active region AA.

<<Problem 2>>

However, even though the above configuration is used, the following new problem is also posed. This problem will be described below with reference to FIG. 20. FIG. 20 is a diagram similar to that in FIG. 19, and also shows a behavior of an electric flux line obtained when a voltage is applied to the control gate 17. In the following description, a level difference between the upper surface of the electric charge accumulating layer 15 of the element isolation region 32 and the upper surface of the element isolation region 32 is called a width S1, and the film thickness of the block layer 16 is called a thickness S2.

As shown in the drawing, when a voltage is applied to the control gate 17, an electric flux line is concentrated on the electric charge accumulating layer 15. More specifically, the electric flux line generated from the control gate 17 is directed to the electric charge accumulating layer 15. When electrons are injected into the electric charge accumulating layer 15, the electric flux line generated from the well region 12 is also directed to the electric charge accumulating layer 15.

However, when shrinking is advanced (for example, a half pitch of the memory cell transistor MT (width of the active region AA in a direction along the word lines) is 40 [nm] or less), the electric flux line generated from the electric charge accumulating layer of the adjacent memory cell transistor MT is directed to a channel region in the semiconductor substrate 10 of an adjacent cell (indicated by an arrow A1 in FIG. 20). For this reason, depending on the number of electric charges in the electric charge accumulating layer of the adjacent cell, an electrostatic potential of a channel portion of the memory cell transistor MT is changed. More specifically, a threshold voltage of the memory cell transistor MT changes depending on the number of electric charges of the electric charge accumulating layer of the adjacent memory cell transistor MT. As a result, a range of a threshold value distribution of the memory cell transistors MT in a memory chip is wider.

This is because the level difference between the upper surface of the electric charge accumulating layer 15 and the element isolation region 32 is a width S1 larger than a width S2 from the upper surface of the electric charge accumulating layer 15 and the upper surface of the block layer 16. Since a parasitic capacitance between the memory cell transistors MT is reduced, a relative dielectric constant of a material used in the silicon oxide film 31 is lower than that of the block layer 16. If the widths S1 and S2 are equal to each other, when the width S1 is converted into a dielectric constant of the block layer, the width S1 is four times the width S2. More specifically, an electric flux line from the block layer 16 is not easily transmitted to the electric charge accumulating layer 15 of the memory cell transistor MT. As a result, the electric charge accumulating layer 15 is easily influenced by the electric flux line from the electric charge accumulating layer of the adjacent memory cell transistor MT.

With the configuration shown in FIG. 19, furthermore, the following problem is posed. As shown in FIG. 20, the upper surface of the electric charge accumulating layer 15 is located at a level lower than the level of the upper surface of the element isolation region 32. For this reason, when a voltage is applied to the control gate 17 in a programming state, an electric field distribution applying on the electric charge accumulating layer 15 fluctuates. As a result, the voltage of the control gate 17 is not sufficiently transmitted to the electric charge accumulating layer 15.

As a result, an electrostatic potential of the channel region of the memory cell transistor MT fluctuates depending on the amount of electrons injected into the electric charge accumulating layer 15. This disadvantageously causes a fluctuation in threshold value of the memory cell transistor MT.

When the above problem is posed, the range of the threshold value distribution of the memory cell transistors MT is widened throughout the whole memory chip. For this reason, in order to reduce the threshold value distribution, a read operation and a rewrite operation must be repeated. As a result, a write operation requires a long period of time. Furthermore, when a fluctuation range in threshold value of the memory cell transistor MT is large, even the threshold value cannot be easily matched with a desired range.

This behavior is indicated by an arrow A2 in FIG. 20. As shown in FIG. 20, an electric flux line does not flow toward the electric charge accumulating layer 15 and flows toward the inside of the element isolation region 32. As a result, an electric field in the electric charge accumulating layer 15 decreases at the positions "p1" and "p2". This behavior is shown in FIG. 21. FIG. 21 is a graph showing an electric field intensity at the position of the electric charge accumulating layer 15. An abscissa indicates a position in a direction along the word lines, and an ordinate indicates an electric field intensity. As shown in FIG. 21, electric field intensities at the ends "p1" and "p2" of the electric charge accumulating layer 15 are lower than that of a central portion of the electric charge accumulating layer 15 by about 10%.

When the electric field intensity fluctuates, a high voltage is disadvantageously required to program data. This is a conspicuous problem in a multi-valued NAND flash memory in which each of the memory cell transistors MT holds data of two or more bits.

This Embodiment

However, in a NAND flash memory according to the embodiment, the above problems can be solved, and the operational reliability of the NAND flash memory can be improved. This will be described below in detail.

Figure 22:
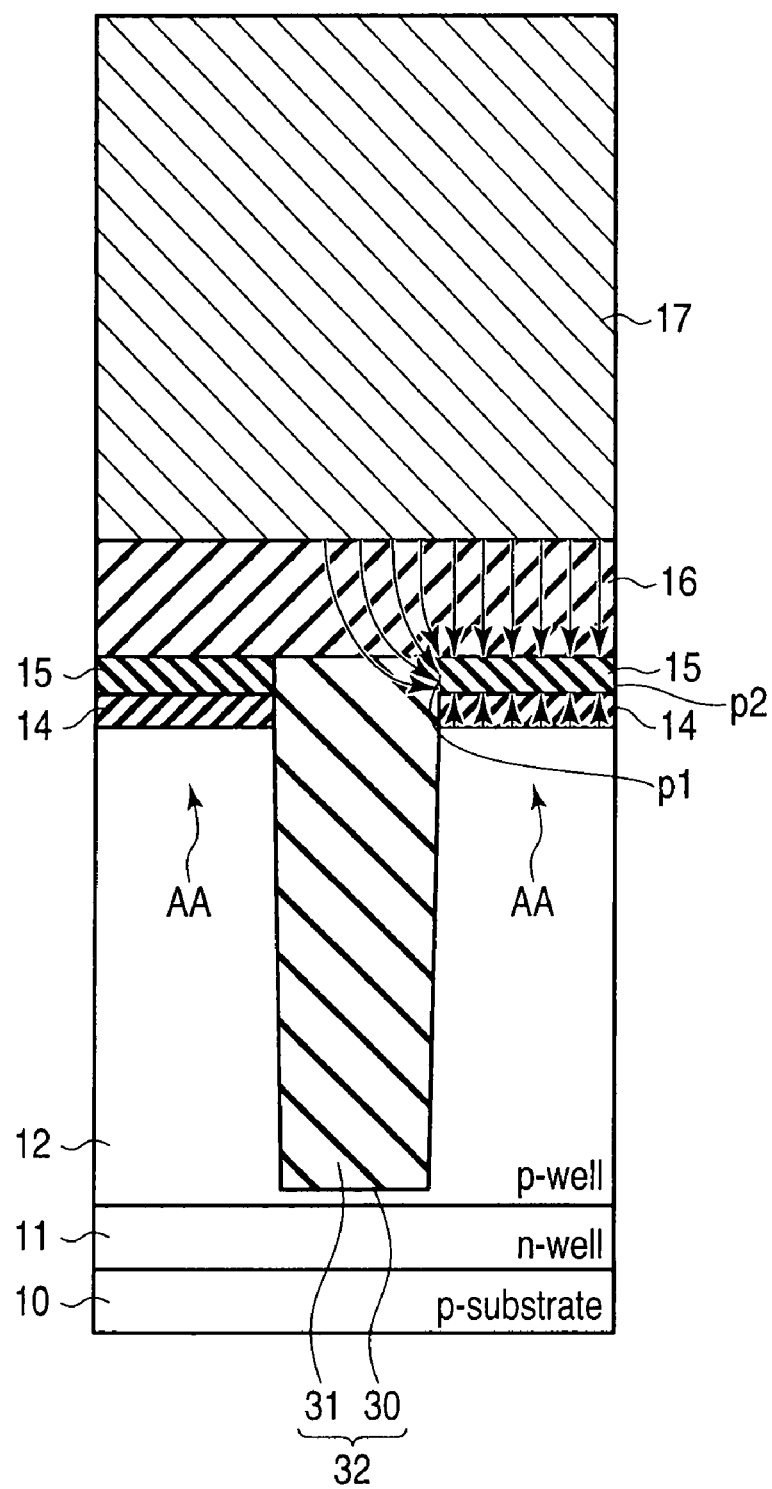
FIG. 22 is a sectional view of the memory cell transistor according to the first embodiment of the present invention along the word line WL.

FIG. 22 is a sectional view of the memory cell transistor MT according to the embodiment in a direction along the word lines, and also shows a behavior of an electric flux line obtained when a voltage is applied to the control gate 17.

<<Effect 1>>

As shown in FIG. 22, between the memory cell transistors MT adjacent to each other in the direction along the word lines, the electric charge accumulating layers 15 are isolated from each other. Therefore, as described above with reference to FIG. 18, the Problem 1 in which a threshold value fluctuates by movement of electrons can be solved.

<<Effect 2>>

With the configuration according to the first embodiment, a fluctuation in electric field distribution of the electric charge accumulating layer 15 when a voltage is applied to the control gate can be suppressed. More specifically, the Problem 2 can be solved. More specifically, as shown in FIG. 22, with the configuration according to the first embodiment, as indicated by an arrow in FIG. 22, electric flux lines generated from the control gates 17 equally flow to the electric charge accumulating layer 15. For this reason, the problem in which an electric field intensity decreases at an end of the electric charge accumulating layer 15 can be solved.

This is because, in the configuration according to the first embodiment, the upper surface of the element isolation region 32 is located on the same plane as that of the upper surface of the electric charge accumulating layer 15.

With this configuration, since a dielectric constant of the block layer 16 is higher than that of the silicon oxide film 31, an electric flux line generated from the control gate 17 is easily concentrated on the electric charge accumulating layer 15. Consequently, for example, in a write operation, an electrostatic potential in a channel region of the memory cell transistor MT is not easily influenced by written data of an adjacent memory cell transistor MT, and a range of a threshold value distribution in the memory chip can be narrowed.

As a result, interference between adjacent memory cell transistors MT can be suppressed, a fluctuation in threshold value of the memory cell transistors MT in a whole memory chip can be suppressed. Furthermore, in a write operation and an erase operation, an electric field of the gate insulating film 14 located at a boundary between the element isolation region 32 and the active region AA can be suppressed from decreasing. For this reason, write and erase operations can be executed with a lower voltage.

Figure 23:
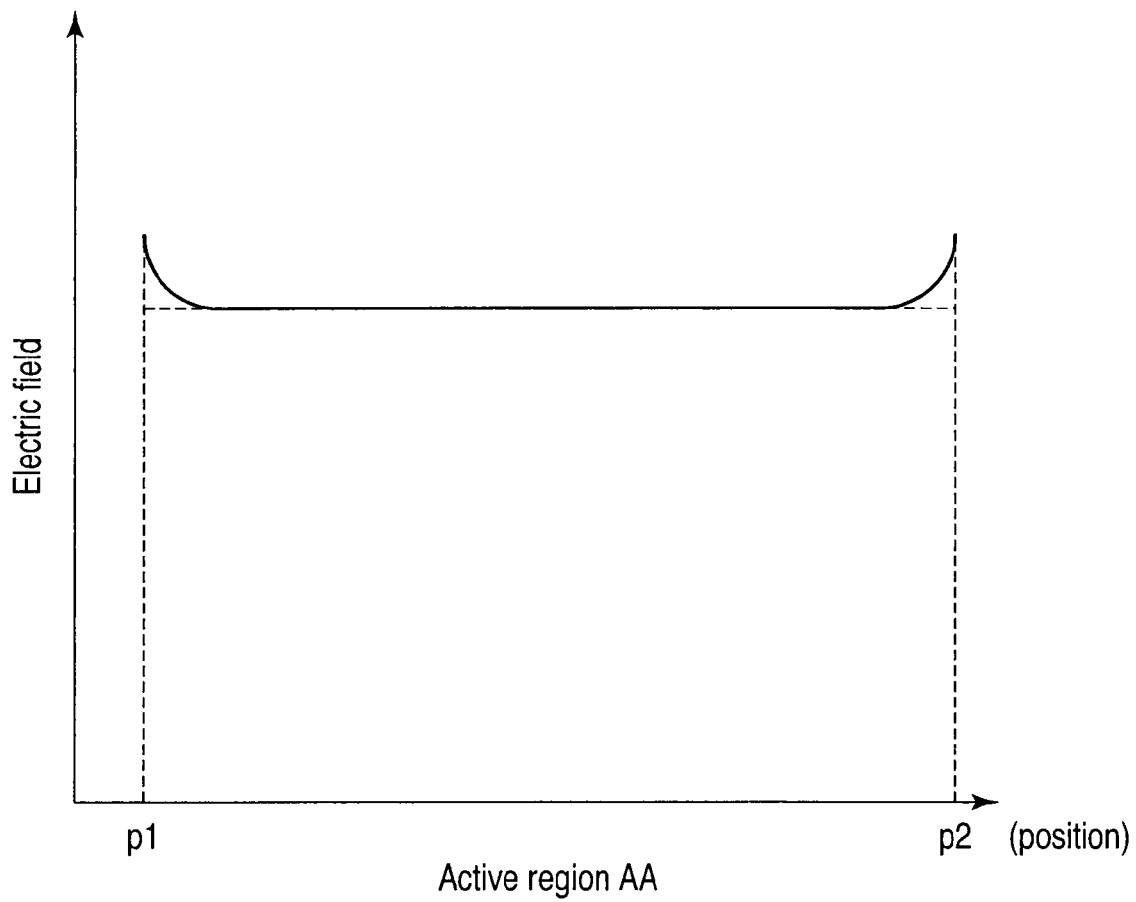
FIG. 23 is a graph showing an electric field applied to an electric charge accumulating layer of the memory cell transistor according to the first embodiment of the present invention.

FIG. 23 is a graph showing an electric field intensity at the position of the electric charge accumulating layer 15 in a NAND flash memory according to the first embodiment. An abscissa indicates a position in a direction along the word lines, and an ordinate indicates an electric field intensity. As shown in FIG. 23, as a result, an electric field intensity in the electric charge accumulating layer 15 rises at the positions "p1" and "p2". More specifically, a voltage applied to the control gate 17 is sufficiently transmitted to the electric charge accumulating layer 15.

Second Embodiment

Figure 24B:
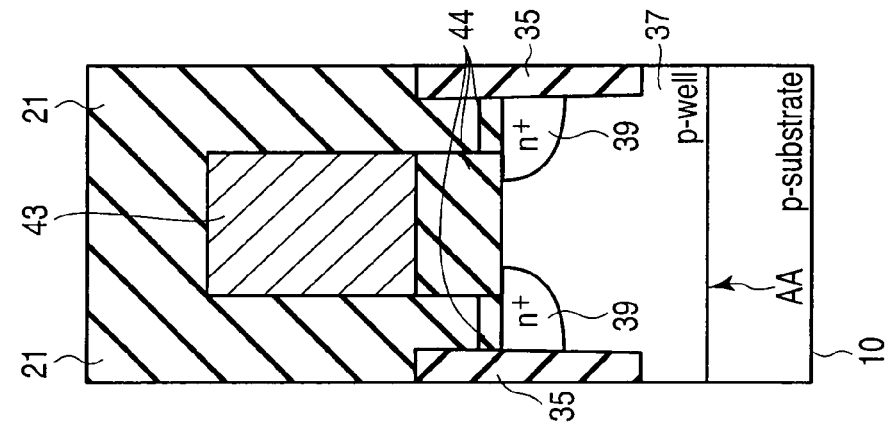
Figure 24A:
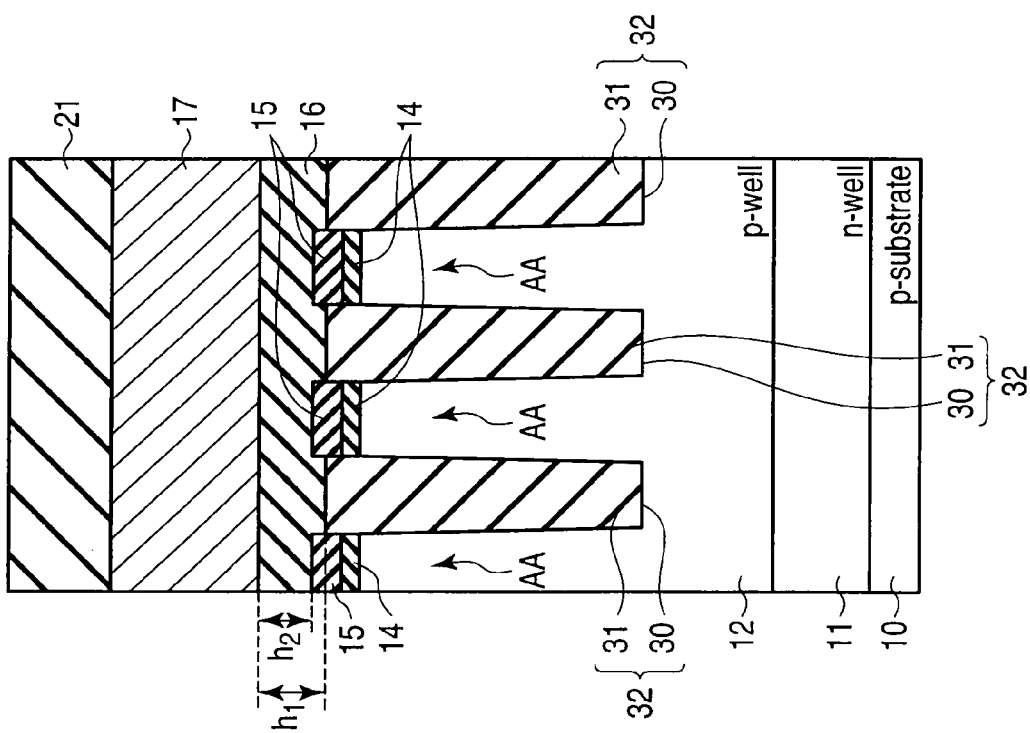

A semiconductor memory device according to a second embodiment of the present invention and a method of manufacturing the semiconductor memory device will be described below. The semiconductor memory device according to the embodiment is obtained by lowering the upper surface of the element isolation region 32 in the first embodiment. FIGS. 24A and 24B show sectional views of the memory cell transistor MT and the peripheral transistor PT2 in the second embodiment. FIG. 24A shows a sectional view of the memory cell transistor MT along a direction of the word lines WL. FIG. 24B shows a sectional view of the peripheral transistor PT2 in a gate length direction.

As shown in FIG. 24A, in the NAND flash memory according to the embodiment, the upper surface of the element isolation region 32 is lower than the upper surface of the electric charge accumulating layer 15 and higher than the lower surface of the electric charge accumulating layer 15 in FIG. 4 shown in the first embodiment. More specifically, in the configuration according to the second embodiment, a distance from the upper surface of the block layer 16 to the upper surface of the element isolation region (silicon oxide film 31) 32 is represented by h1, and a distance from the upper surface of the block layer 16 to the upper surface of the electric charge accumulating layer 15 is represented by h2. In this case, a relationship given by h1>h2 is established.

The configuration except for the configuration described above is the same as that of the semiconductor memory device according to the first embodiment. Since the configuration of the peripheral transistor PT2 shown in FIG. 24B is the same as that of the semiconductor memory device according to the first embodiment, a description thereof will not be repeated here.

A method of manufacturing a semiconductor memory device according to the embodiment will be described below with reference to FIGS. 25A and 25B. FIG. 25A is a sectional view of the memory cell transistor MT in a direction of the word lines WL. FIG. 25B is a sectional view of the peripheral transistor PT2 in a gate length direction. In FIG. 25A, of the steps in manufacturing the semiconductor memory device according to the first embodiment, an upper surface of the insulating film 31 is further etched by anisotropic etching or wet etching in FIG. 11 to adjust a level of the upper surface of the element isolation region 32. More specifically, FIG. 25A shows the steps up to the steps shown in FIG. 10 in the first embodiment. Thereafter, in the step shown in FIG. 11, the upper surface of the element isolation region 32 is removed by, for example, dry etching. When the element isolation region 32 is removed in this step, an etching amount is adjusted to make the upper surface of the element isolation region 32 lower than the upper surface of the electric charge accumulating layer 15 and to make the upper surface of the element isolation region 32 higher than the lower surface of the electric charge accumulating layer 15. Thereafter, the silicon oxide film 46 and the buffer silicon layer 45 are removed by, for example, wet etching. With the above steps, a structure shown in FIG. 25 is obtained.

At this time, in the peripheral transistor PT2 shown in FIG. 25B, in particular, a high-voltage MOS transistor, it is preferable that the upper surface of the element isolation region 35 is not removed to prevent a breakdown-voltage defect between the gate electrode 43 and the p-type semiconductor substrate 10. The peripheral transistor PT2 shown in FIGS.

Figure 26A:
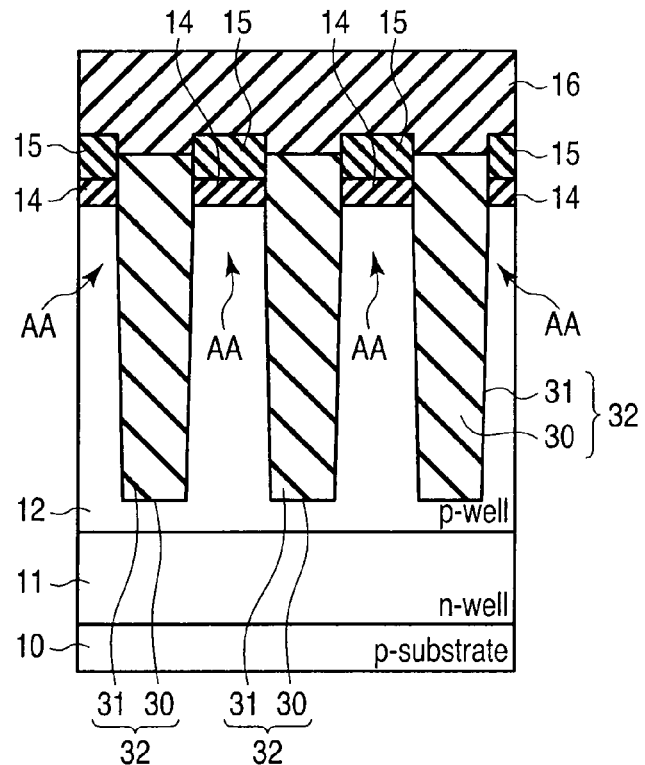
FIGS. 26A and 26B are sectional views showing parts of the steps of manufacturing the memory cell transistor and the peripheral transistor PT2 according to the second embodiment of the present invention.
Figure 26B:
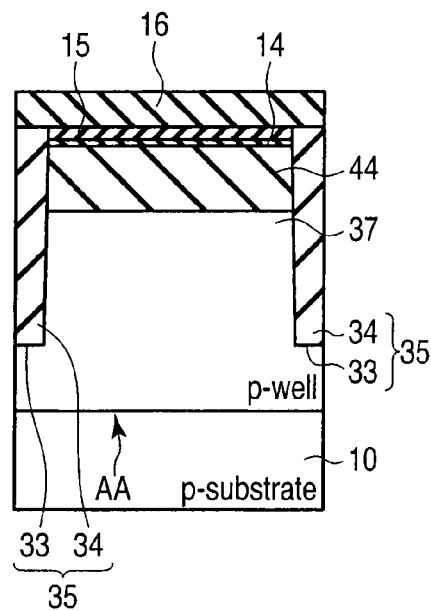

25B and 26B goes through the steps in FIGS. 14D to 17D described in the first embodiment subsequent to the step in FIG. 26B to complete the structure shown in FIG. 24B.

In FIG. 25A, on the upper surface of the element isolation region 32 is removed by dry etching. Thereafter, as a result of the step of removing the silicon oxide film 46 and the buffer silicon layer 45 by wet etching, trenches 50 are formed. Thereafter, the insulating layer 16 is laminated on the upper surfaces of the electric charge accumulating layer 15 and the element isolation region 32 to bury the trenches 50, so that a structure shown in FIG. 26A is obtained. Thereafter, the resultant structure goes through the steps in FIGS. 14 to 17 described in the first embodiment to complete the structure shown in FIG. 24A. FIG. 26A is a sectional view of the memory cell transistor MT along a word line WL and FIG. 26B is a sectional view of the peripheral transistor PT2 in the gate length direction As described above, also in the semiconductor memory device according to the second embodiment and the method of manufacturing the semiconductor memory device, the same effect as that in the first embodiment is obtained.

More specifically, even though the upper surface of the element isolation region 32 is removed to a position which is lower than the upper surface of the electric charge accumulating layer 15 formed on the active region AA and higher than the lower surface of the electric charge accumulating layer 15, the same effect as described above is obtained. More specifically, a shift of a threshold value caused by an electric flux line generated from an adjacent memory cell transistor MT can be prevented. As a result, a high-reliable semiconductor memory device can be realized. This is because, when a voltage is applied to the control gate 17, an electric distance from the control gate 17 to the electric charge accumulating layer 15 in the selection memory cell transistor MT is shorter than a distance from the control gate 17 to the element isolation region 32. For this reason, the voltage applied to the control gate 17 is sufficiently transmitted to the memory cell transistor MT. As a result, as shown in FIG. 21, since the electric flux line is not disturbed, and the threshold value of the memory cell transistor MT is not shifted as described above, a semiconductor memory device having high operational reliability can be realized.

The position of the upper surface of the element isolation region 32 means the upper surface of the element isolation region 32 at a point at which the element isolation region 32 is in contact with a side surface of the electric charge accumulating layer 15. When the position of the upper surface of the element isolation region 32 at the contact point of the electric charge accumulating layer 15 is lower than the upper surface of the electric charge accumulating layer 15, an electric distance from the control gate 17 to the electric charge accumulating layer 15 in the selection memory cell transistor MT is shorter than a distance from the control gate 17 to the element isolation region 32. For this reason, the effect as described above is obtained.

Figure 27B:
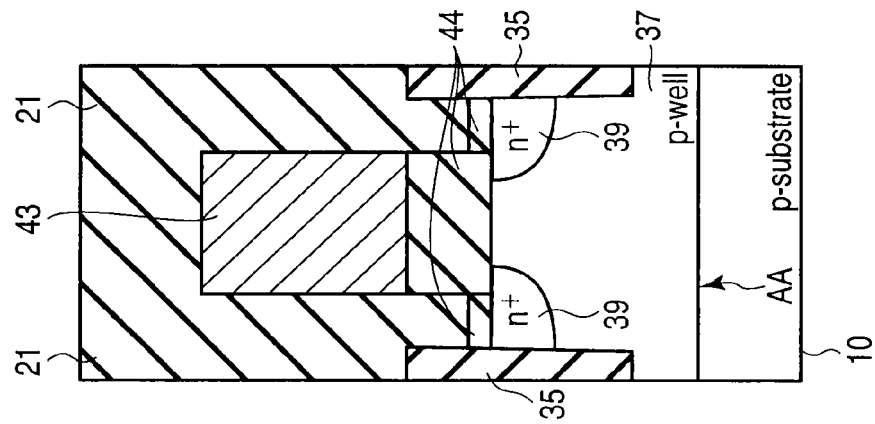
FIGS. 27A and 27B are sectional views of the NAND flash memory according to the second embodiment of the present invention.
Figure 27A:
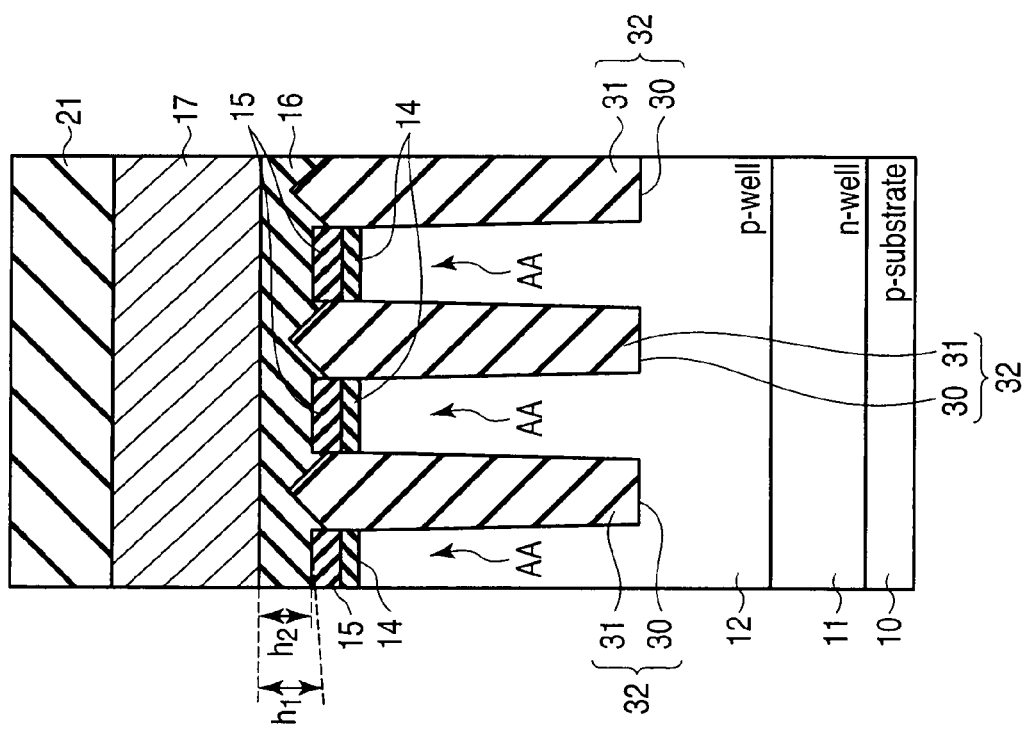

Furthermore, FIG. 27A is a sectional view of the memory cell transistor MT according to a modification of the second embodiment in a direction of the word lines WL, and a sectional view which is especially focus attention on the element isolation region 32 FIG. 27B shows a sectional view of the peripheral transistor PT2 in a gate length direction. A configuration of the peripheral transistor PT2 shown in FIG. 27B is the same as the semiconductor memory device according to the first embodiment, and a description thereof will not be repeated here.

FIG. 27A shows a sectional view of the memory cell transistor MT according to a modification of the second embodiment. The memory cell transistor MT according to the embodiment shown in FIG. 27A is obtained such that the element isolation region 35 has one apex in FIG. 24A. The apex is higher than the lower surface of the block layer 16. In the direction of the word lines WL, a contact between one of the ends of two sides which share the apex and the electric charge accumulating layer 15 is lower than the upper surface of the electric charge accumulating layer 15. More specifically, as shown in FIG. 27A, a position of a contact between the electric charge accumulating layer 15 and one end of the two sides is lower than the upper surface of the electric charge accumulating layer 15, and the apex of the element isolation region 32 is made higher than the upper surface of the electric charge accumulating layer 15, so that a capacitance of the block layer 16 between the memory cell transistors MT decreases. As a result, a parasitic capacitance between the memory cell transistors MT can be suppressed.

Third Embodiment

Figure 28B:
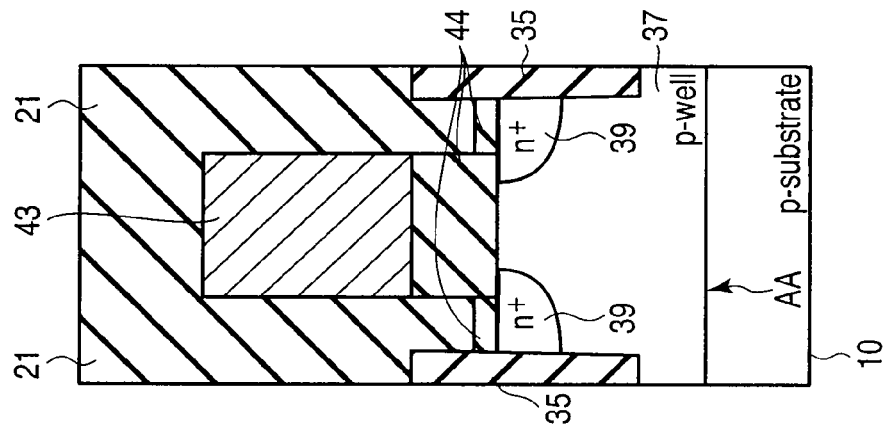
FIGS. 28A and 28B are sectional views of a NAND flash memory according to a third embodiment of the present invention.
Figure 28A:
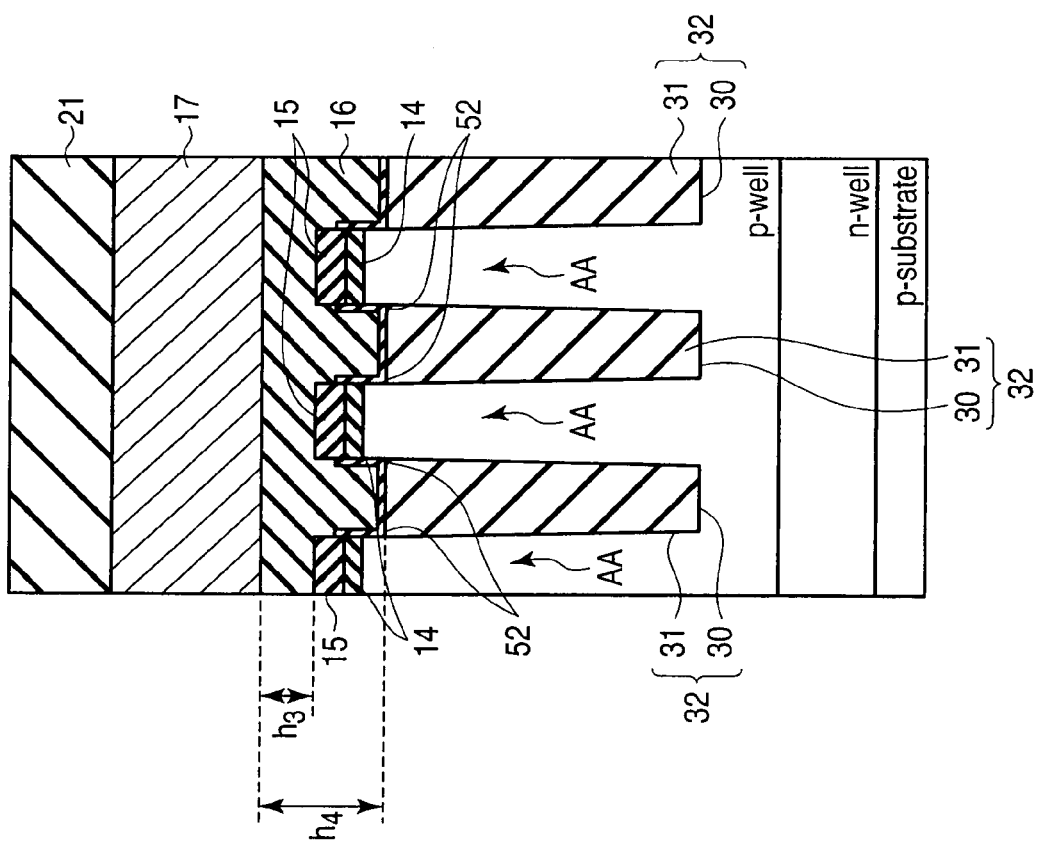

A semiconductor memory device according to a third embodiment of the present invention and a method of manufacturing the semiconductor memory device will be described below. The semiconductor memory device according to the embodiment is obtained by further lowering the upper surface of the element isolation region 32 in the second embodiment. Sectional views of the memory cell transistor MT and the peripheral transistor PT2 according to the embodiment in a direction of the word lines WL are shown in FIGS. 28A and 28B. FIG. 28A shows a sectional view of the memory cell transistor MT in the direction of the word lines WL. FIG. 28B shows the sectional view of the peripheral transistor PT2 in a gate length direction. Since the peripheral transistor PT1 is the same as that of the first embodiment, a description thereof will not be repeated here.

As shown in FIG. 28A, the NAND flash memory according to the embodiment is obtained by making the upper surface of an element isolation region lower than the lower surface of the gate insulating film 14 in FIG. 4 of the first embodiment. More specifically, with the configuration according to the embodiment, a film thickness from the upper surface of the block layer 16 to the upper surface of the electric charge accumulating layer 15 is represented by h3, and a distance from the upper surface of the block layer 16 to the upper surface of the element isolation region (silicon oxide film 31) 32 is represented by h4. In this case, a relationship given by h4>h3 is established.

In a side wall of the active region AA exposed by setting down the upper surface of the element isolation region 32 and an upper surface of the element isolation region 32, for example, a silicon oxide film 52 is formed as an insulating film. The silicon oxide film 52 except for on the side wall of the active region AA, for example, the silicon oxide film 52 on the element isolation region 32 can also be removed. The other configuration is the same as that of the semiconductor memory devices according to the first and second embodiments. Since the configuration of the peripheral transistor PT2 shown in FIG. 28B is the same as that of the semiconductor memory device according to the first embodiment, a description thereof will not be repeated here.

As a result of the above configuration, the block layer 16, the gate insulating film 14, and the p-type semiconductor substrate 10 are isolated from each other by the silicon oxide film 52. More specifically, in a region in which the block layer 16 steps over the element isolation region 32, the silicon oxide films 52 are formed between the block layer 16 and the gate insulating film 14 and between the block layer 16 and the p-type semiconductor substrate 10.

Figure 29A:
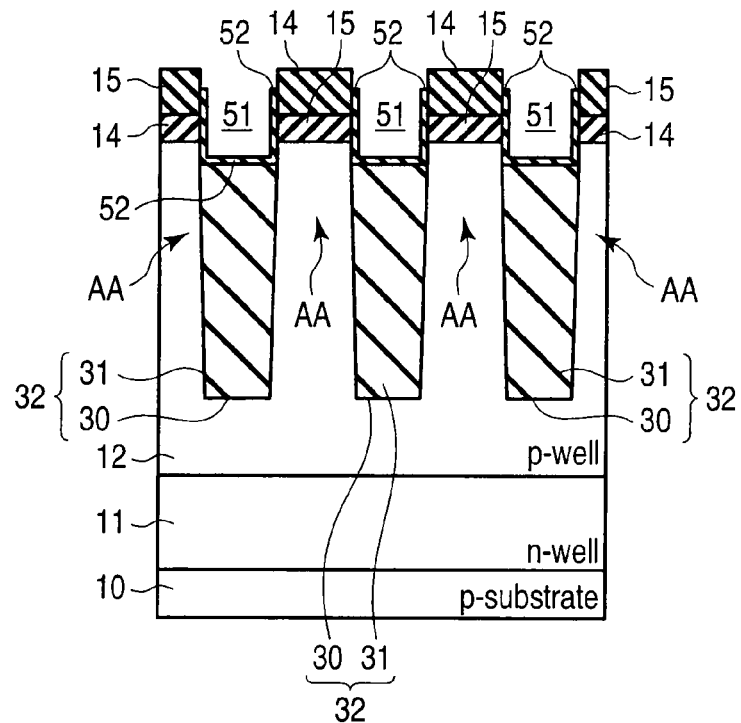
FIGS. 29A and 29B are sectional views showing parts of the steps of manufacturing the memory cell transistor and the peripheral transistor PT2 according to the third embodiment of the present invention.
Figure 29B:
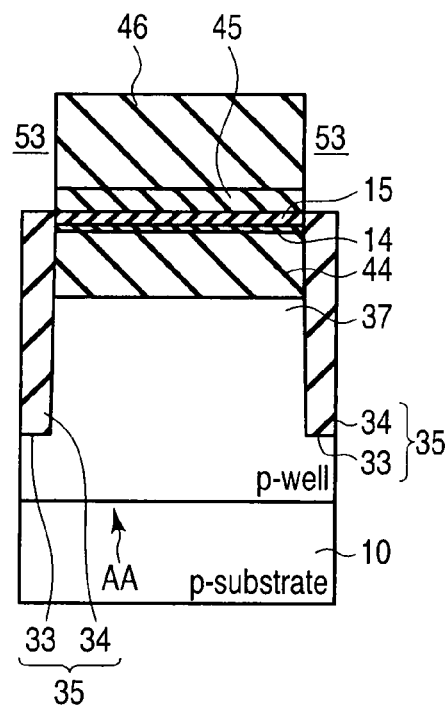

The method of manufacturing a semiconductor memory device according to the embodiment will be described below with reference to FIGS. 29A and 29B. FIG. 29A is a sectional view of the memory cell transistor MT in a direction of the word lines WL. FIG. 29B is a sectional view of the peripheral transistor PT2 in a gate length direction. FIG. 29A shows a structure in which, of the steps in manufacturing a semiconductor memory device according to the first embodiment, in FIG. 11, the upper surface of the element isolation region 32 is made lower than the lower surface of the gate insulating film 14 by using anisotropic etching or wet etching. More specifically, first, the steps up to the step shown in FIG. 10 in the first embodiment are performed. Thereafter, the upper surface of the element isolation region 32 is removed by dry etching in the step in FIG. 11. In this step, an etching amount is adjusted such that the upper surface of the element isolation region 32 is made lower than the gate insulating film 14. Thereafter, the SiN film 46 and the buffer silicon layer 45 are removed by, for example, wet etching.

As a result of the above steps, trenches 51 shown in FIG. 29A are formed. Side walls of the adjacent active regions AA are exposed. On the side wall of the active region AA and the upper surface of the element isolation region 32, the silicon oxide film 52 is laminated by using, for example, CVD. At this time, the silicon oxide film 52 is formed to cover the side wall of at least the exposed active region AA and to preferably cover the side wall of the gate insulating film 14. This structure is obtained by performing anisotropic etching after the lamination of the silicon oxide film 52. The structure is also obtained by performing thermal oxidation after the side wall of the active region AA is exposed. As a matter of course, the silicon oxide film 52 may also be formed on the side wall of the insulating film 15. As a result, the structure shown in FIG. 29A is obtained.

At this time, in the peripheral transistor PT2 shown in FIG. 29B, in particular, a high-voltage MOS transistor, it is preferable that the upper surface of the element isolation region 35 is not removed to prevent a breakdown-voltage defect between the gate electrode 43 and the p-type semiconductor substrate 10. For this reason, the peripheral transistor PT2 shown in FIGS. 29B and 30B goes through the step in FIG. 30B and the steps in FIGS. 14D to 17D described in the first embodiment to complete a structure shown in FIG. 28B. FIG. 30A is a sectional view of the memory cell transistor MT along a word line WL and FIG. 30B is a sectional view of the peripheral transistor PT2 in the gate length direction The silicon oxide film 52 may be formed on the upper portion of the element isolation region 35. In this case, a breakdown-voltage between the gate electrode 43 and the p-type semiconductor substrate 10 can be effectively improved.

In FIG. 29A, the block layer 16 is laminated on the upper surfaces of the electric charge accumulating layer 15 and the element isolation region 32 to obtain FIG. 30A. More specifically, the trenches 51 are buried with the block layer 16. However, due to the presence of the silicon oxide film 52, the block layer 16 is not in direct contact with the active region AA and the gate insulating film 15. Thereafter, the resultant structure goes through the steps in FIGS. 14 to 17 described in the first embodiment to complete the configuration in FIG. 28A.

As described above, even in the semiconductor memory device according to the third embodiment and the method of manufacturing the semiconductor memory device, the same effects as those in the first and second embodiments are obtained.

In the first to third embodiments, a NAND flash memory is exemplified. However, in the first to third embodiments, it may also be applied to a 3Tr-NAND flash memory obtained by making the number of memory cell transistors in a NAND flash memory one, or a NOR flash memory. It can also be applied to a 2Tr flash memory obtained by excluding the selection transistor ST1 on the drain side in the 3Tr-NAND flash memory, and may also be generally applied to nonvolatile semiconductor memories of a laminated gate structure.

The method of manufacturing a semiconductor memory device is not limited to the steps described above. More specifically, in FIGS. 8A to 8D, after the electric charge accumulating layer 15 is formed, the buffer silicon layer 45 and the SiN film 46 need not be formed on the electric charge accumulating layer 15. Thereafter, by using a photolithography technique and anisotropic etching, trenches 30 and 33 which penetrate the electric charge accumulating layer 15 and the gate insulating film 14 and have bottom surfaces which are in contact with the inside of the p-type semiconductor substrate 10 are formed. The silicon oxide films 31 and 34 are then buried in the trenches 30 and 33 to form the element isolation regions 32 and 35. Furthermore, the silicon oxide film on the electric charge accumulating layer 15 is removed by CMP using the electric charge accumulating layer 15 as a stopper. Thereafter, the block layer 16 is formed on the electric charge accumulating layer 15 and the element isolation regions 32 and 35 shown in FIG. 13. Thereafter, the control gate 17 is formed on the block layer 16. More specifically, the resultant structure goes through the steps subsequent to the step in FIG. 15 to obtain the structure of the semiconductor memory device according to the embodiment. In the steps in the embodiment, an order of the steps of manufacturing the peripheral transistors PT1 and PT2 formed on the same p-type semiconductor substrate 10 is arbitrarily determined. More specifically, before and after the memory cell transistor MT is formed, the peripheral transistors PT1 and PT2 may be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first active region and a second active region formed in a semiconductor substrate, respectively;
an element isolation region which is formed in the semiconductor substrate and which isolates the first active region and the second active region from each other; and
memory cell transistors which are formed on the first active region and the second active region, respectively and each of which includes a laminated gate and a first impurity diffusion layers functioning as a source and a drain,
the laminated gate including a first insulating film which is formed on the semiconductor substrate and which accumulates electric charges, a second insulating film formed on the first insulating film by using a material having a dielectric constant higher than that of the first insulating film, and a control gate electrode formed on the second insulating film, the second insulating film being commonly connected between the memory cell transistors to step over the element isolation region and being in contact with an upper surface of the element isolation region, and an upper surface of the element isolation region being higher than a bottom surface of the first insulating film and, a center portion of the upper surface of the element isolation region being level with the upper surface of the first insulating film.

2. The device according to claim 1, wherein the first insulating film is a laminated film including a first gate insulating film formed on the semiconductor substrate and an electric charge accumulating layer formed on the first gate insulating film.

3. The device according to claim 2, wherein the first gate insulating film has any one of a configuration in which $SiO_2$, $NH_3$, and NO nitride films, a configuration in which an $SiO_2$ film, an Si film, and SiO film are sequentially laminated, a configuration in which an $SiO_2$ film, an Si film, and $SiO_2$ film are sequentially laminated, a configuration in which an $SiO_2$ film, an SiN film, and an $SiO_2$ film are sequentially laminated, a configuration in which an $SiO_2$ film, an Si fine-particle film, and an $SiO_2$ film are sequentially laminated, and a configuration in which an $SiO_2$ film, an $Al_2O_3$ film, and an $SiO_2$ film are sequentially laminated.

4. The device according to claim 2, further comprising:

a first MOS transistor including a first gate electrode formed on the semiconductor substrate through the second gate insulating film and a second impurity diffusion layers functioning as a source and a drain and has an impurity concentration profile different from that of the first impurity diffusion layer; and a second MOS transistor including a second gate electrode formed on the semiconductor substrate through a third gate insulating film and a third impurity diffusion layers functioning as a source and a drain and has an impurity concentration profile different from those of the first impurity diffusion layer and the second impurity diffusion layer, the first gate insulating film, the second gate insulating film, and the third gate insulating film having film thicknesses different from each other.

5. The device according to claim 4, wherein the apex is located to be higher than upper surfaces of the electric charge accumulating layers.

6. The device according to claim 2, wherein an upper surface of the element isolation region has an apex, one end of two sides which share the apex in a direction of the control gate are located to be higher than bottom surfaces of the electric charge accumulating layers formed on the first active region and the second active region and lower than an upper surface of the electric charge accumulating layer.

7. The device according to claim 1, wherein the second insulating film is formed by an $Al_2O_3$ single film or an LaAlO single film.

8. The device according to claim 1, wherein a dielectric constant of the element isolation region is lower than that of the first insulating film.

9. The device according to claim 1, wherein the upper surface of the element isolation region is flat.

* * * * *